(12) United States Patent
Takahashi et al.

(10) Patent No.: US 6,191,476 B1
(45) Date of Patent: Feb. 20, 2001

(54) SEMICONDUCTOR DEVICE

(75) Inventors: Kunihiro Takahashi; Mizuaki Suzuki; Tsuneo Yamazaki; Hiroaki Takasu; Kunio Nakajima; Atsushi Sakurai; Tadao Iwaki; Yoshikazu Kojima; Masaaki Kamiya, all of Tokyo (JP)

(73) Assignee: Seiko Instruments Inc. (JP)

( * ) Notice: Under 35 U.S.C. 154(b), the term of this patent shall be extended for 0 days.

(21) Appl. No.: 08/859,571

(22) Filed: May 20, 1997

Related U.S. Application Data

(63) Continuation of application No. 08/135,172, filed on Oct. 12, 1993.

(30) Foreign Application Priority Data

| Oct. 21, 1992 | (JP) | 4-283091 |
| Feb. 23, 1993 | (JP) | 5-33601 |
| Mar. 12, 1993 | (JP) | 5-52477 |
| Jun. 30, 1993 | (JP) | 5-162957 |
| Jul. 21, 1993 | (JP) | 5-180484 |
| Sep. 7, 1993 | (JP) | 5-222627 |

(51) Int. Cl.⁷ .............................. H01L 23/10; H01L 23/34
(52) U.S. Cl. ................................. 257/706; 257/707
(58) Field of Search .................................. 257/705, 707, 257/706, 67, 37, 35, 717

(56) References Cited

U.S. PATENT DOCUMENTS

| 4,024,626 | 5/1977 | Leupp et al. | 29/571 |
| 4,352,120 | * 9/1982 | Kurihara et al. | 257/705 |
| 4,571,610 | * 2/1986 | Matsushita | 257/705 |
| 4,609,930 | 9/1986 | Yamazaki | 357/23.7 |
| 4,698,662 | * 10/1987 | Young et al. | 257/707 |
| 4,748,485 | 5/1988 | Yasudev | 357/23.7 |
| 4,751,196 | 6/1988 | Pennell et al. | 437/84 |
| 4,875,086 | 10/1989 | Malhi et al. | 357/54 |
| 4,963,701 | * 10/1990 | Yasumoto et al. | |
| 5,057,908 | * 10/1991 | Weber | |
| 5,235,233 | * 8/1993 | Yamamoto | |

FOREIGN PATENT DOCUMENTS

| 2715446 | 10/1978 | (DE) . |
| 134283 | 2/1979 | (DE) . |
| 0136509 | 4/1985 | (EP) . |
| 0164646 | 12/1985 | (EP) . |
| 0211402 | 2/1987 | (EP) . |
| 0268380 | 5/1988 | (EP) . |
| 0342925 | 11/1989 | (EP) . |
| 57-167655 | 10/1982 | (JP) . |
| 59-126639 | 7/1984 | (JP) . |
| 60-111475 | 6/1985 | (JP) . |
| 60-143666 | 7/1985 | (JP) . |
| 63-36512 | 2/1988 | (JP) . |
| 2-28354 | 1/1990 | (JP) . |
| 2-250362 | 10/1990 | (JP) . |

OTHER PUBLICATIONS

Patent Abstracts of Japan, vol.13, No.228 (P–877) May 26, 1989 JP–A–1 038 727 (NEC) Feb. 9, 1989.

(List continued on next page.)

*Primary Examiner*—Sheila V. Clark
(74) *Attorney, Agent, or Firm*—Adams & Wilks

(57) ABSTRACT

To provide a semiconductor substrate and a light-valve semiconductor substrate capable of preventing the threshold value of a MOS transistor on a single-crystal silicon device forming layer from increasing and forming a MOS integrated circuit with a high reliability even for a long-time operation. A semiconductor substrate and a light-valve semiconductor substrate comprising a single-crystal silicon thin-film device forming layer 5001 formed above an insulating substrate 5004 through an adhesive layer 5003 and an insulating layer 5002 formed on the single-crystal silicon thin-film device forming layer, wherein a heat conductive layers 5201 and 5202 made of a material with a high heat conductivity are arranged between the single-crystal silicon thin-film device forming layer and the adhesive layer and on the insulating layer.

24 Claims, 24 Drawing Sheets

OTHER PUBLICATIONS

Patent Abstracts of Japan, vol.13, No.578 (E–864) Dec. 20, 1989 JP–A–1 241 862 (SONY) Dec. 26, 1989.
Patent Abstracts of Japan, vol.10, No.298 (P–505) Oct. 9, 1986 JP–A–61 114 225 (MATSUSHITA) May 31, 1986.
Patent Abstracts of Japan, vol.10, No.1, (E–371) Jan. 7, 1986 JP–A–60 167 364 (MATSUSHITA) Aug. 30, 1985.
Patent Abstracts of Japan, vol.13, No.572, (P–978) Dec. 18, 1989 JP–A–1 239 530 (SEIKO EPSON) Sep. 25, 1989.
Patent Abstracts of Japan, vol.15, No.287 (P–1229) Jul. 22, 1991 JP–A–3 100 156 (SHARP) Apr. 25, 1991.
Electronics Letters, vol.25, No.15, Jul. 20, 1989, pp. 1009–1011, R.P. Zingg et al., "High–Quality Dual–Gate PMOS Devices in Local Overgrowth (LOG)".
Patents Abstracts of Japan, vol.8, No.70 (E–235) (1507) Apr. 3, 1984.
IEEE Transactions on Electron Devices, vol.37, No.1 Jan. 1990, pp. 121–127.
Japanese Journal of Applied Physics, vol.29, No.4, part 2, Apr. 1990, pp. L521–L523.
Fujitsu Scientific and Technical Journal, vol.24, No.4 & index, Dec. 1988, pp. 408–417.
Patent Abstracts of Japan, vol. 012, No. 246 (E–632) Jul. 12, 1988 and JP–A–63–036512, Feb. 17, 1988.
Patent Abstracts of Japan, vol. 014, No. 175 (E–0914) Apr. 6, 1990 and JP–A–02–028354, Jan. 30, 1990.
Patent Abstracts of Japan, vol. 009, No. 266 (E–352) Oct. 23, 1985 and JP–A–60–111475, Jun. 17, 1985.
Patent Abstracts of Japan, vol. 014, No. 576 (E–016) Dec. 21, 1990 and JP–A–02–250362, Oct. 8, 1990.

* cited by examiner

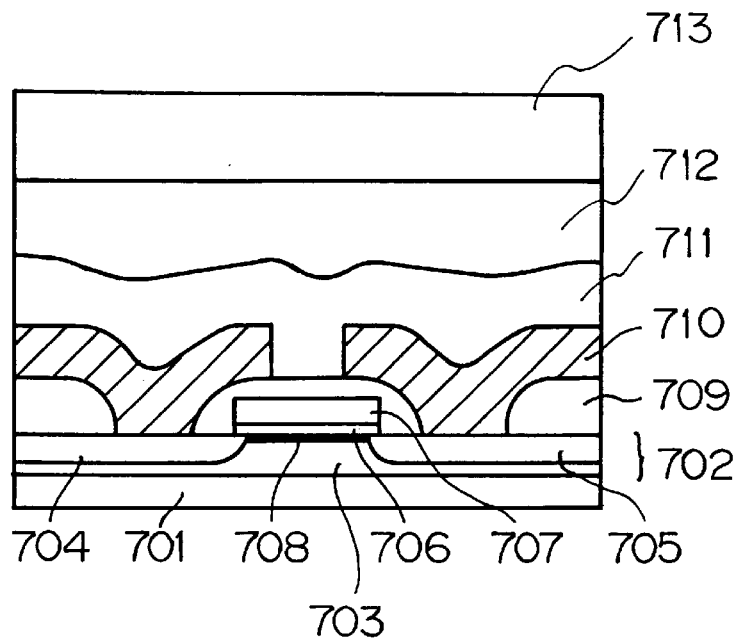
FIG. 7
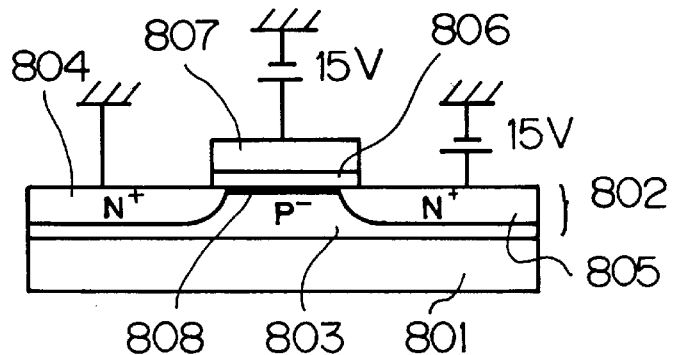
FIG. 8
FIG. 9
PRIOR ART
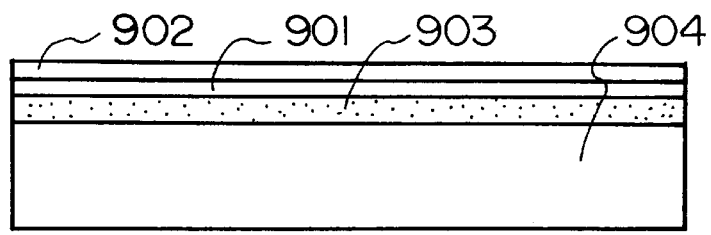

SEMICONDUCTOR DEVICE

This is a continuation application of application Ser. No. 08/135,172 filed Oct. 12, 1993.

BACKGROUND OF THE INVENTION

The present invention relates to a semiconductor device and to a fabrication method therefor. Moreover, the present invention relates to a substrate arrangement for driving a flat-plate light valve used for a direct-view display device and a projection-type display device.

More specifically, the present invention relates to a semiconductor integrated circuit substrate arrangement in which a group of pixel electrodes, a group of switches, and a group of driving circuit elements are formed on a single-crystal semiconductor silicon film on at electrical insulator. The substrate arrangement is integrated with, for example, a liquid crystal panel to constitute the so-called active-matrix arrangement.

Particularly, the present invention relates to a semiconductor device having a structure effective for minimizing the generation of heat in the semiconductor device or preventing the temperature of the semiconductor device from rising by releasing the heat from the semiconductor device when heat is generated.

An existing active-matrix arrangement is made by forming amorphous silicon or polycrystalline silicon on an electrical insulator such as a transparent glass substrate or transparent quartz substrate and further forming some or all of a group of picture element electrodes, a group of switching elements, and a group of driving circuit elements on the amorphous or polycrystalline silicon. However, it is not yet been successfully attempted to form all of the picture element group, switching element group, and driving circuit group on a single-crystal semiconductor film over an electrical insulator.

The substrate in which a semiconductor such as silicon is formed on an electrically insulating film is commonly called SOI (Silicon On Insulator), which is now recognized as a semiconductor device structure having a high operation speed and high integration density.

FIG. 2 shows a sectional view of a wafer having the SOI structure. In FIG. 2, reference symbol 21 is a single-crystal silicon substrate with a thickness of 500 to 1000 microns, 22 is a silicon oxide film with a thickness of over hundred angstroms to several microns, 23 is a single-crystal silicon film with a thickness of one hundred angstroms to several microns.

For a semiconductor integrated circuit made of an SOI wafer, the single-crystal silicon layer 23 on the electrical insulating film 22 is very thin. Therefore, when the integrated circuit comprises a complementary MIS transistor (complementary metal-insulator-semiconductor transistor; hereafter referred to as complementary MIS Tr), there are advantages that electric capacities between source and substrate, between drain and substrate, and between gate and substrate are decreased, the operation speed of the integrated circuit can be increased, a device isolation region between transistors can be formed very small, and the integration density can be increased as compared to when the integrated circuit is formed on a bulk single-crystal silicon wafer because the electric insulator 22 is present.

FIGS. 3(a) to 3(d) show a method for making single-crystal silicon on an existing insulating film using a method of bonding a single-crystal silicon layer with an oxidized single-crystal silicon layer.

In FIG. 3(a), bulk single-crystal silicon 301 is thermally oxidized to form a silicon oxide $SiO_2$ layer 302.

In FIGS. 3(b) and 3(c), the silicon with $SiO_2$ prepared in FIG. 3(a) is bonded with the single-crystal silicon 303 at a high temperature.

In FIG. 3(d), the thickness of the silicon 301 on whose surface $SiO_2$ is formed is decreased up to several microns or less through grinding or etching.

As shown in FIG. 3(d), conventional SOI generally has a structure in which an $SiO_2$ layer 302 is present between thick single-crystal silicon 303 and thin single-crystal silicon 301.

For an SOI wafer, because the insulating film 302 is present just under the thin single-crystal silicon 301 on which an integrated circuit is formed, the heat generated by the current flowing when the integrated circuit operates is not released to the thick conductive single-crystal silicon 303 under the insulating film 302 but it is collected in the thin single-crystal silicon layer 301 and serves to raise the temperature of the thin single-crystal silicon layer with the passage of time.

When the integrated circuit comprises a complementary MIS Tr, the current flowing through the transistor increases and the temperature elevation rate also increases if the transistor size is decreased to increase the integration density.

If the temperature of thin single-crystal silicon layer rises, carrier trap levels are easily generated in a gate insulator of the MIS transistor, causing transistor characteristic fluctuation, and degrading the integrated circuit reliability.

FIG. 4 is a sectional view showing another embodiment of a semiconductor device. The sectional view in FIG. 4 shows an N-type metal-oxide semiconductor field-effect transistor (hereafter referred to as MOS Tr) formed on poycrystalline silicon (hereafter referred to as Poly-Si) on an insulating substrate.

Reference numeral 401 is a transparent substrate made of glass or quartz, 402 and 403 are a source and drain containing N-type impurities at a high concentration of approx. $1\times10^{19}$ to $1\times10^{20}$ $cm^{-3}$ respectively, and 404 is a P-well region containing little or few impurites or containing impurities at a low concentration of about $1\times10^{16}$ $cm^{-3}$.

The source 402, drain 403, and P-well 404 are formed in Poly-Si. Symbols 405 and 406 are silicon oxide $SiO_2$ formed by oxidizing Poly-Si containing the source 402, drain 403, and P-well 404. The $SiO_2$ 405 of these two silicon oxide films $SiO_2$ serves as a gate insulator of an N-type MOS Tr.

Symbol 407 is Poly-Si containing N-type impurities at a high concentration of approx. $1\times10^{20}$ $cm^{-3}$, which serves as a gate of a MOS Tr. An N-type MOS Tr comprises the source 402, drain 403, P-well 404, gate insulator 405, and gate, 407. Symbol 408 is an intermediate insulating film formed by depositing a silicon oxide, 409 is a source electrode made of aluminum, and 410 is a drain electrode made of aluminum. The intermediate insulating film 408 is removed from portions where the source electrode 409 contacts the source 402 and the drain electrode 410 contacts the drain 403. Symbol 411 is a passivation film made of a silicon nitride film or silicon oxide.

Also for an existing semiconductor having the sectional structure shown in FIG. 4, the transparent insulating substrate 401 under the N-type MOS Tr is an insulator and the intermediate insulating film 408 and the passivation film 411 above the N-type MOS Tr are insulating films. Therefore, the heat produced when current flows through the N-type MOS Tr formed in Poly-Si is hardly released from the Poly-Si.

For the structure of a transistor made of amorphous silicon (hereafter referred to as a-Si) formed on the transparent insulating substrate mainly used for a display device though not illustrated, an insulating substrate is present under the transistor and an insulating film such as a passivation film is present above it. Therefore, the heat generated when a current flows through the transistor is not released from the transistor but it is easily collected in the transistor.

In recent years, the size of a transistor (hereafter referred to as Tr) constituting an integrated circuit formed on single-crystal silicon has been continually decreased. For example, when the integrated circuit comprises a complementary metal-oxide-semiconductor transistor (hereafter referred to as CMOS Tr), the length of the Tr is already decreased to 1 $\mu$m or less, and moreover a length of 0.2 to 0.3 $\mu$m has recently been realized.

FIG. 5 shows a sectional view of a semiconductor which is a sectional view of an N-type MOS Tr formed in single-crystal silicon.

Reference numeral 501 is a single-crystal silicon layer containing P-type impurities at a low concentration of approx. $1 \times 10^{16}$ cm$^{-3}$, 502 and 503 are a source and drain containing N-type impurities at a high concentration of approx. $1 \times 10^{20}$ cm$^{-3}$ respectively, 504 is a gate insulator, 505 is a gate made of Poly-Si containing N-type impurities at a high concentration of approx. $1 \times 10^{20}$ cm$^{-3}$, 506 is an intermediate insulator made of a silicon oxide for preventing the gate 505 and aluminum wires 507 and 508 from shorting, 507 is an aluminum layer electrically connected to the source 502, 508 is an aluminum layer electrically connected to the drain 503, and 509 is a passivation film made of, for example, a silicon nitride film. In FIG. 5, the N-type MOS Tr comprises the single-crystal silicon layer 501, source 502, drain 503, gate insulating film 504, and gate 505.

As the length L of the gate 505 decreases to 0.5 $\mu$m or less, the current flowing between the source 502 and drain 503 increases. As a result, the temperature of the single-crystal silicon layer 501 rises. The heat produced in the N-type MOS Tr is also transmitted to the aluminum layers 507 and 508 because the source 502 and drain 503 are electrically connected to the aluminum layers 507 and 508. However, because the existing passivation film on the aluminum layers is made of a silicon nitride film or silicon oxide which is inferior in thermal conductivity, the heat transmitted to the aluminum layers 507 and 508 is not released outside the passivation film and therefore, the temperature of the region where Tr is formed rises.

Thus, when the transistor size decreases, the current flowing through the transistor increases. Therefore, the current flowing through the entire integrated circuit is very large compared with the existing current. As a result, the heat produced in the integrated circuit increases and the temperature of the integrated circuit rises. If the temperature of the single-crystal silicon layer where the integrated circuit is formed rises, carrier trap-levels are easily generated in the gate insulator of the MOS Tr, the transistor characteristic fluctuates, and the integrated circuit reliability is degraded.

Moreover, a semiconductor substrate and a semiconductor for a light valve are already known in which a single-crystal silicon thin film device forming layer is formed on an insulating support substrate through an adhesive layer and an insulating layer is formed on the single-crystal silicon thin film device forming layer, respectively.

When a transistor formed on single-crystal silicon on an insulating substrate is operated for an extended time, that is, when current flows through the Tr for a long time, the temperature of the single-crystal silicon where the current flows rises due to the heat produced due to flowing of the current. When the temperature of an electrical insulator or thin single-crystal silicon film rises, the heat is not released and the temperature continuously rises as long as current flows because single-crystal silicon is thin and the thin single-crystal silicon is surrounded by electrical insulators and air.

A MOS Tr which is the most popular type of MIS Tr is described below for ease of understanding. Every reference to a MOS Tr below is also applicable to the MIS Tr in general.

FIG. 6 shows a sectional view of a MOS Tr formed on a substrate in which a thin single-crystal silicon layer 602 with a thickness of 0.1 to several microns is formed on a quartz layer 601 with a thickness of several hundreds of microns to 1000 microns. Reference numerals 603 and 604 are source and drain of the MOS Tr, 605 is a well region, 606 is a gate oxide, and 607 is a gate made of Poly-Si. Reference numeral 608 is a channel serving as a current path of the MOS Tr. Though omitted in FIG. 6, the upper portions of the source 603, drain 604 and gate 607 are covered with an insulator such as a silicon oxide or silicon nitride film. Quartz serving as an electrical insulator is also present under the thin single-crystal silicon layer 602. Therefore, when current flows through the channel 608 serving as a current path and heat is produced, the heat of the channel 608 is barely released and the temperature proximate the channel 608 is raised since the upper portion of the channel 608 is surrounded by the electrical insulating film such as a silicon oxide film or a silicon nitride film and the insulator of the quartz 601 under the single-crystal silicon layer 602.

FIG. 7 shows another sectional view of the MOS Tr formed on a single-crystal silicon layer on an electrical insulator. Symbol 701 is a silicon oxide with a thickness of over thousand angstroms to several $\mu$m and 702 is a thin single-crystal silicon layer with a thickness of 1 to several microns. The MOS Tr is formed by forming a well 703, source 704 and drain 705 in the thin single-crystal silicon layer 702 and also forming a gate 707 comprising a gate oxide 706 and a Poly-Si layer deposited thereon.

Reference numerals 709 denotes an interlayer insulating film made of silicon oxide and 710 is aluminum metalization which is connected to the source 704 and drain 705 separately. Reference numeral 711 is a passivation film made of a silicon nitride film, 712 is an adhesive with a thickness of several $\mu$m, and 713 is a glass substrate with a thickness of over hundred to 1000 $\mu$m.

Also in FIG. 7, when current flows through a channel 708 serving as a current path of the MOS Tr, the heat produced in the channel due to flowing of the current is hardly released and thereby the channel temperature rises because the lower portion of the thin single-crystal silicon layer 702 is surrounded by the silicon oxide 701 and the upper portion of it is surrounded by the silicon oxide 709 and passivation film 711 and moreover by insulators such as the adhesive 712 and glass substrate 713.

For a semiconductor for a light valve substrate on which a group of pixel switching transistors (hereafter referred to as Sw-Tr group) for selectively supplying electric power to a pixel electrode and a driving circuit for driving the pixel Sw-Tr group are formed, a high voltage of approx. 15 V is applied to the gate electrode and drain electrode of a pixel Sw-Tr to selectively operate the Sw-Tr when the Sw-Tr comprises a MOS Tr.

In this case, a very large current flows through a MOS Tr formed on single-crystal silicon independently of whether the MOS Tr is a P-type or N-type MOS Tr. Therefore, the channel section of the Sw-Tr formed on the thin single-crystal silicon on the electrical insulator has a high temperature.

FIG. 8 shows a sectional view of an N-type MOS Tr formed on a thin single-crystal silicon layer 802 on an electrical insulator 801. Symbol 801 is a silicon oxide with a thickness of 0.1 to several μm, 802 is a thin single-crystal silicon layer with a thickness of 0.1 to 2 microns, 803 is a p-well, and 804 and 805 are source and drain regions, respectively. Symbol 806 is a gate insulator made of a silicon oxide and 807 is a gate made of Poly-Si. Symbol 808 is a channel serving as a current path of the MOS Tr.

In FIG. 8, the source 804 is grounded and a high voltage of 15 V is applied to the drain 805 and the gate 807. In this case, because the gate 807 and drain 805 have the same potential, no electric field is generated between the gate and drain at the both sides of the gate insulator 806. However, an intense electric field is applied to the gate insulator close to the source. Another problem is caused by the two events of high temperature and intense electric field. That is, excessive trap levels for capturing carriers flowing through the channel 808 are generated in the vicinity of the source 804. Because many flowing carriers are captured by these traps, a problem occurs in that the threshold voltage (gate voltage when current starts flowing between source and drain; hereafter referred to as Vt) of the N-type MOS Tr slowly rises while current flows. For an N-type MOS Tr, flowing carriers are electrons and carriers captured by traps are also electrons. For a P-type MOS Tr, flowing carriers are holes and carriers captured by traps are also holes. Therefore, Vt of the P-type MOS Tr fluctuates in the direction in which the absolute value of Vt increases. This is because, when flowing carriers are captured by traps of a gate insulator, a gate voltage with a high absolute value is required to form a channel, that is, to invert a well layer just under the gate insulator 806.

For the semiconductor device for a light valve substrate, the voltage to be applied to the Sw-Tr group of a pixel section requires a high voltage of 10 V or higher, for example, 15 V, in order to drive a liquid crystal. However, the voltage to be applied to most transistors of a driving circuit section is a relatively low voltage of 5 V or lower. In this case, the intensity of the electric field applied between the gate and source of most transistors constituting the driving circuit is approx. ⅓ as low as that of the electric field applied between the gate and source of the Sw-Tr of the pixel section.

The number of trap levels of carriers generated in a gate insulator, as described above, relates to a high temperature of the channel section and the intensity of an electric field between a gate and source. A large number of trap levels are not generated by only one of these two factors, such as, for example, only the high temperature of the channel section. The density of traps generated in the gate insulator increases as the temperature of the channel section gets higher and the intensity of the electric field between the gate and source gets higher.

Therefore, most transistors with a low intensity of the electric field between a gate and source do not have so many trap levels in the gate insulator or very large Vt fluctuation of the transistors.

In a semiconductor device for a light valve arrangement in which a pixel Sw-Tr group for selectively supplying electric power to pixel electrodes and a driving circuit for driving the pixel Sw-Tr group are formed on single-crystal silicon thin film disposed on an electrical insulator, some of the transistors constituting the driving circuit and all of the Sw-Tr's of the pixel section are main transistors having Vt fluctuations when a high-intensity electric field is applied between a gate and drain, a large current flows through a channel, the channel temperature rises, a high-intensity electric field is applied between a gate and source, and carrier trap levels are generated in a gate oxide.

It is an object of the present invention to minimize the Vt fluctuation of a pixel Sw-Tr in which a high voltage is applied to the gate and drain of a semiconductor device for a light valve device in which a pixel Sw-Tr group for selectively supply electric power to pixel electrodes and a driving circuit for driving the pixel Sw-Tr group are formed on a thin single-crystal silicon layer on the above electrical insulator.

Though it has been attempted by applicants to form a shading film so that no incident light strikes a pixel Sw-Tr, some of the light penetrates around the shading film to irradiate the pixel Sw-Tr in most cases. Carriers generated due to light are the cause of a leakage current.

It is therefore also an object of the present invention to control the Vt fluctuation of the pixel Sw-Tr and to decrease the leakage current due to incident light.

The present invention provides a semiconductor device with a high reliability such as an integrated circuit or display device by preventing the temperature rise of a single-crystal silicon thin film formed on which is an integrated circuit comprising a miniaturized Tr described above, or which is part of an SOI wafer, and also by preventing the temperature of Poly-Si formed on an insulating substrate, or a transistor formed in a-Si from rising.

Moreover, it has been found that the conventional semiconductor substrate and the semiconductor substrate for a light valve having a structure shown in FIG. 9 also have a problem in that the Vt of a MOS transistor increases due to the operation of the MOS transistor when the MOS transistor is formed on a single-crystal silicon thin-film device forming layer.

In FIG. 9, symbol 901 is a single-crystal silicon thin-film device forming layer, 902 is an insulating layer, 903 is an adhesive layer and 904 is an insulating support substrate. Concerning the above problem, because one surface of the single-crystal silicon thin-film device forming layer 901 contacts the thick insulating support substrate 904 with a low heat conductivity through the adhesive layer 903 and the other surface of the layer 901 contacts the air with a low heat conductivity through the insulating layer 902 in the semiconductor substrate and the semiconductor for a light valve having the structure shown in FIG. 9, the heat produced due to the operation of a MOS transistor is stored in the single-crystal silicon thin-film device forming layer and many carriers are deeply trapped into the gate insulator of the MOS transistor, and the Vt of the MOS transistor is therefore increased.

To solve the above problem, it is effective to quickly release the heat produced due to the operation of the MOS transistor without storing it in the single-crystal silicon thin-film device forming layer.

It is an object of the present invention to provide a semiconductor substrate and in particular, a semiconductor substrate for a light valve for solving the above problem, preventing the threshold value of the MOS transistor from increasing, and forming a MOS integrated circuit superior in reliability.

The problems to be solved by the present invention described above are summarized below.

(1) To minimize the Vt fluctuation of a pixel Sw-Tr of a semiconductor device for a light valve substrate in which a pixel Sw-Tr group for selectively supplying electric power to pixel electrodes and a driving circuit for driving the pixel Sw-Tr group are formed on a thin single-crystal silicon layer on an electrical insulator.

(2) To minimize leakage current due to light of the Sw-Tr.

(3) To prevent the temperature of single-crystal silicon, Poly-Si, and a-Si from rising due to the heat produced by the operation of Tr's formed in the single-crystal silicon, Poly-Si, and a-Si on an electrical insulator.

(4) To prevent the temperature of single-crystal silicon from rising due to the heat produced by the operation of a miniaturized Tr in single-crystal silicon.

(5) To release the heat produced in a single-crystal silicon thin-film device layer in a semiconductor substrate, and in particular, a semiconductor substrate for a light valve, having an insulating layer on a single-crystal silicon thin-film device forming layer through an adhesive layer on an insulating support substrate.

SUMMARY OF THE INVENTION

The present invention comprises the following means to solve the above five problems.

Means for solving the problem (1)

<1> The length of a pixel Sw-Tr comprising a MOS Tr is larger than the minimum gate length among the gate lengths of many MOS Tr's forming a driving circuit.

<2> The pixel Sw-Tr comprises a double drain structure (LDD structure: Lightly Doped Drain structure) in which the impurity concentrations of the source and drain decrease at the side close to a channel and increases at the side far from the channel.

Means for solving the problem (2)

The gate width of the pixel Sw-Tr is equal to or smaller than the minimum gate width among the gate widths of many MOS Tr's forming the driving circuit.

Means for solving the problem (3)

<1> To form integrated circuits in single-crystal silicon, some of the circuits are formed in a region for easily releasing heat, that is, a single-crystal silicon region where no electrical insulator is embedded and other circuits consuming less power, having a low operation frequency, or requiring a high operation speed are formed on an electrical insulator or in a single-crystal silicon layer.

<2> For a semiconductor film (single-crystal silicon, Poly-Si, or a-Si) on an insulator, an insulating film is formed with an aluminum nitride (AlN) layer or a multiple layer of an aluminum nitride layer and other insulating film. Moreover, the thin semiconductor film is made to contact the aluminum nitride layer at a portion of the thin semiconductor film. Or, metallic wiring made of Poly-Si in the integrated circuit formed on the thin semiconductor film layer is made to locally contact the aluminum nitride layer.

Furthermore, a passivation film is formed with an insulating film with a high heat conductivity such as aluminum nitride.

Means for solving the problem (4)

The passivation film is formed with an insulating film with a high heat conductivity such as aluminum nitride.

Means for solving the problem (5)

A layer made of a material superior in the heat conductivity is formed so that the layer sticks fast to an insulating layer contacting a single-crystal silicon thin-film device forming layer. Or, it is featured that a heat radiating function is added by forming a layer made of a material superior in heat conductivity so that the layer adheres to an adhesive layer contacting the single-crystal silicon thin-film device forming layer.

The following advantages are realized by the above-described means for solving the above five problems.

Function produced by the means for solving the problems (1) and (2)

When a high voltage is applied to the gate and drain of the MOS-Tr formed on the thin single-crystal silicon layer on the electrical insulator for a long time, Vt fluctuates. The magnitude of the Vt fluctuation increases as the current flowing through the MOS Tr increases, that is, as the intensity of an electric field between source and drain increases.

By increasing the gate length of a pixel Sw-Tr in which a high voltage is applied to the source and drain or applying the LDD structure to the source and drain, it is possible to decrease the intensity of the electric field between the source and drain and therefore decrease the current flowing between the source and drain. As a result, it is possible to decrease the Vt fluctuation of the pixel Sw-Tr to which a high voltage is applied. Moreover, by decreasing the gate width of the pixel Sw-Tr to minimize the area of the Sw-Tr, it is possible not only to decrease the area where heat is produced but to decrease the leakage current produced due to incident light.

Function Produced by the Means <1> for Solving the Problem (3)

It is possible to obtain the high-speed integrated circuit of the present invention comprising the above-mentioned constitution and having a high reliability and stable performance by forming a circuit with a high operation frequency and large power consumption on single-crystal silicon in a region free from electrical insulating films or forming a high-speed circuit capable of easily releasing the heat produced on the circuit and having a small operation frequency and small power consumption on a thin single-crystal silicon on an electrical insulating film.

Function Produced by the Means <2> for Solving the Problem (3).

The semiconductor device of the present invention having the above structure prevents the temperature of a semiconductor film layer on an insulator from rising because the heat produced by an integrated circuit formed on a semiconductor film layer on an insulating film is transmitted to aluminum nitride superior in the heat conductivity constituting part or whole of the insulator.

Moreover, because a passivation film formed of Aluminum nitride over the semiconductor film is superior in the heat conductivity to a conventional passivation layer, heat is easily released from the upper portion of the semiconductor film and thereby the temperature of the semiconductor film on the insulating film is prevented from rising.

Function Produced by the Means for Solving the Problem (4)

Similarly, because the passivation film formed at the upper portion of the integrated circuit formed on the single-crystal silicon substrate is superior in the heat conductivity, heat is easily released not only from the single-crystal silicon substrate but from the upper portion of the integrated circuit and therefore the heat produced by the integrated circuit is easily released to the air outside the device.

Function Produced by the Means for Solving the Problem (5)

Because it is possible to quickly release the heat produced by a MOS integrated circuit formed on a single-crystal silicon thin-film device forming layer by using the semiconductor substrate and the semiconductor substrate for a light valve of the present invention, the Vt of a MOS transistor can be prevented from increasing even after operation for a long time and a MOS integrated circuit superior in reliability can be formed.

BRIEF DESCRIPTION OF THE DRAWINGS

FIG. 7 is a sectional view of a MOS transistor formed on a single-crystal silicon layer on a silicon oxide film;

FIG. 8 is a sectional view of a MOS transistor formed on a single-crystal silicon layer on an electrical insulator;

FIG. 9 is a typical sectional view of a conventional semiconductor substrate;

DETAILED DESCRIPTION OF THE PREFERRED EMBODIMENTS

The present invention is described below in detail with reference to the attached drawings.

First, embodiments of the present invention for the problems (1) and (2) are described.

Figure 10:
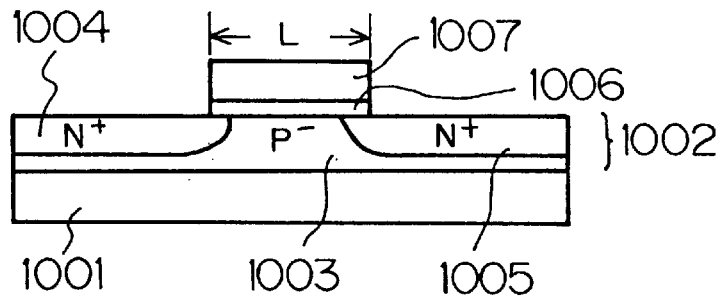
FIG. 10 is a sectional view of a MOS transistor having a normal structure formed on a single-crystal silicon layer on an electrical insulator.

FIG. 10 shows a sectional view of a normal MOS Tr on an electrical insulator. Symbol 1001 is an electrical insulator such as a silicon oxide or quartz, 1002 is a thin single-crystal silicon film with a thickness of 0.1 to 2μm, 1003 is a P-well containing P-type impurities at a low concentration, 1004 and 1005 are a source and drain containing N-type impurities at a high concentration having the conducting type opposite to that of the P-well, 1006 is a gate insulating film and 1007 is a gate made of a Poly-Si film.

Figure 11:
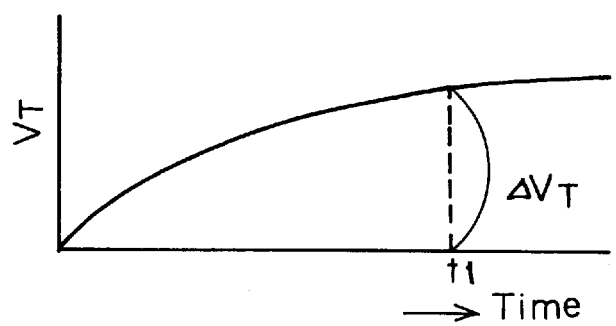
FIG. 11 is a graph showing the change of Vt with time while a MOS transistor formed on a single-crystal silicon layer on an electrical insulator operates at a high voltage.

When applying the voltage shown in FIG. 8 to the Tr shown in FIG. 10 for a long time, Vt of the Tr changes according to elapse of time as shown in FIG. 11.

Figure 12:
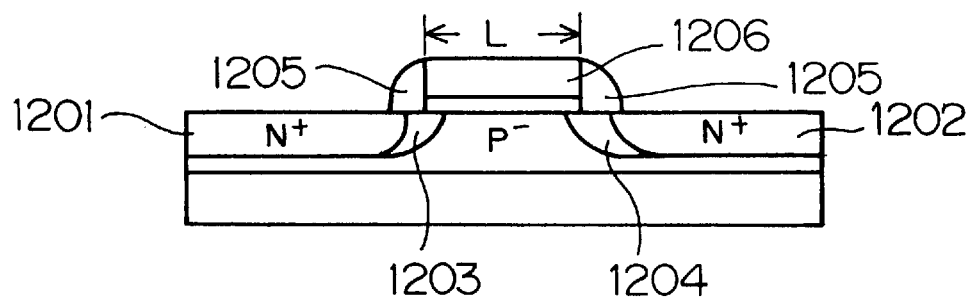
FIG. 12 is a sectional view of an LDD-structure MOS transistor formed a single-crystal silicon layer on an electrical insulator.

FIG. 12 shows a sectional view of a MOS Tr having the LDD structure on an electrical insulator. In FIG. 12, a description of each element corresponding to that shown in FIG. 10 is omitted for simplification. Symbols 1201 and 1202 are source and drain containing N-type impurities at a high concentration of approx. $1 \times 10^{20}$ cm$^{-3}$ respectively and 1203 and 1204 are a source and drain containing N-type impurities at a relatively low concentration of approx. 1 to $5 \times 10^8$ cm$^{-3}$ respectively. Symbol 1205 is a side spacer made of a silicon oxide film formed to make the LDD structure. The source 1203 and drain 1204 at a relatively low impurity concentration are formed through ion implantation before the side spacer 1205 is formed and the source 1201 and drain 1202 at a high impurity concentration are formed through ion implantation after the side spacer 1205 is formed. Symbol 1206 is a gate.

FIGS. 10 and 12 show the length of the gates 1007 and 1206 as L. As the gate length L increases, the electric field intensity decreases and there is also a current decrease even if the voltage applied between the source and drain is the same. The current flowing through the MOS Tr having the LDD structure in FIG. 12 is less than the current flowing through the normal MOS Tr in FIG. 10 even if the gate length is the same because the source 1203 and drain 1204 at a relatively low impurity concentration having the LDD structure serve as resistances when the same voltage is applied between the source and drain at a high impurity concentration.

Figure 13:
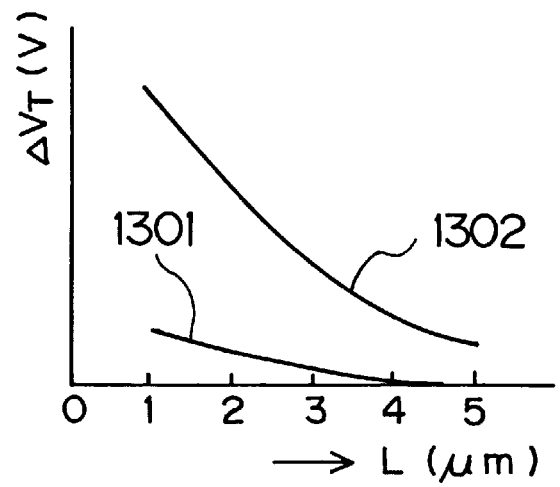
FIG. 13 is a graph showing the change of Vt with respect to time by using a gate length as a parameter while a normal-structure MOS transistor and an LDD-structure MOS transistor formed on a single-crystal silicon layer on an electrical insulator operate at a high voltage.

When applying the voltage shown in FIG. 8 to a MOS Tr formed in thin single-crystal silicon on an electrical insulator for a long time, the Vt fluctuation shown in FIG. 11 appears. In this case, the value of the Vt fluctuation at the time t1 is assumed to be ΔVt. FIG. 13 shows the value of ΔVt when variously changing the gate length L in the normal-structure MOS Tr shown in FIG. 10 and the LDD-structure MOS Tr shown in FIG. 12. Symbol 1301 is the value of ΔVt of the LDD-structure MOS Tr and 1302 is the value of ΔVt of the normal-structure MOS Tr.

From FIG. 13, it is seen that ΔVt increases as L decreases and ΔVt of the LDD-structure MOS Tr is much smaller than that of the normal-structure MOS Tr. This characteristic is applicable to both the N-type MOS Tr and P-type MOS Tr.

Figure 14:
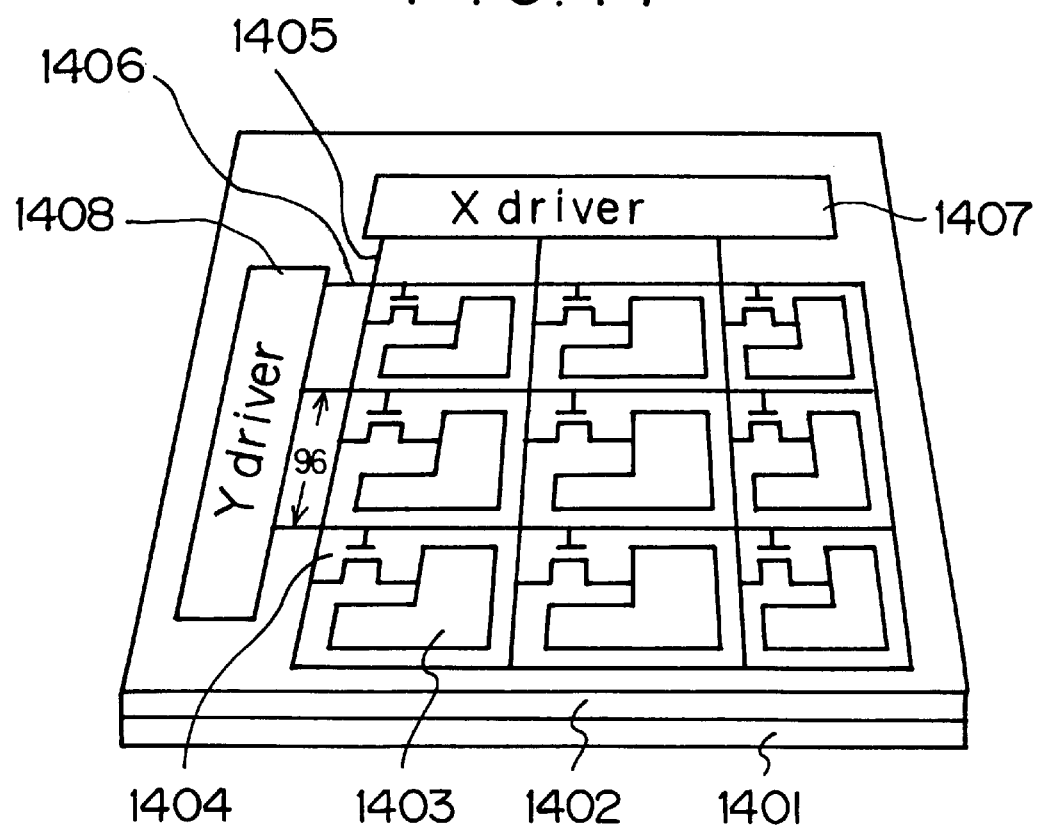
FIG. 14 is a perspective view of the construction of a semiconductor device used as a light valve substrate according to the present invention.

FIG. 14 shows a perspective view showing the construction of a semiconductor device for a light valve serving as an active-matrix arrangement. Symbol 1401 is a silicon oxide serving as an electrical insulating substrate and 1402 is a thin single-crystal silicon semiconductor film formed on the electrical insulating substrate 1401. Symbol 1403 is a driving electrode for driving each pixel and no opaque single-crystal silicon is left under the driving electrode 1403. Symbol 1404 is a pixel Sw-Tr for selectively supplying electric power to the driving electrode of each pixel. The pixel Sw-Tr comprises a MOS Tr. Symbol 1405 is a signal line connected to the drain electrode of each pixel Sw-Tr 1404. Symbol 1406 is a scanning line connected to the gate electrode of each pixel Sw-Tr 1404. Symbol 1407 is an X driver sending a signal to each signal line 1405 and 1408 is a Y driver for sending a signal to each scanning line 1406. The driving electrode 1403 of each pixel, pixel Sw-Tr 1404, signal line 1405, scanning line 1406, X driver 1407, and Y driver 1408 are formed in the single-crystal silicon semiconductor film 1402 or on the single-crystal silicon semiconductor film 1402 through an insulator. The X driver 1407 and Y driver 1408 comprise at least a CMOS Tr comprising an N-type MOS Tr and P-type MOS Tr.

The present invention is characterized by making the gate length of the pixel Sw-Tr serving as a MOS Tr larger than the minimum gate length among the gate lengths of many MOS Tr's forming a driving circuit comprising the X driver 1407 and Y driver 1408 in FIG. 14 for driving a pixel Sw-Tr formed on thin single-crystal silicon on an electrical insulator in order to minimize the Vt fluctuation of the pixel Sw-Tr caused by a high voltage of approx. 15 V applied to the gate and drain electrodes of the pixel Sw-Tr. If the minimum gate length among the gate lengths of many MOS Tr's forming the driving circuit is 2 μm, the gate length of the pixel Sw-Tr is set to 4 to 5 μm. Moreover, by using an LDD-structure MOS Tr for the pixel Sw-Tr formed on thin single-crystal silicon on an electrical insulating film, the Vt fluctuation of the pixel Sw-Tr further decreases even if a high voltage of 15 V is applied to gate and drain.

The pixel Sw-Tr described above is an N-type MOS Tr as an example. However, a P-type MOS Tr can be also used. The characteristics shown in FIGS. 11 and 12 are also directly applicable to a P-type MOS Tr formed on thin single-crystal silicon on an electrical insulator.

Figure 15:
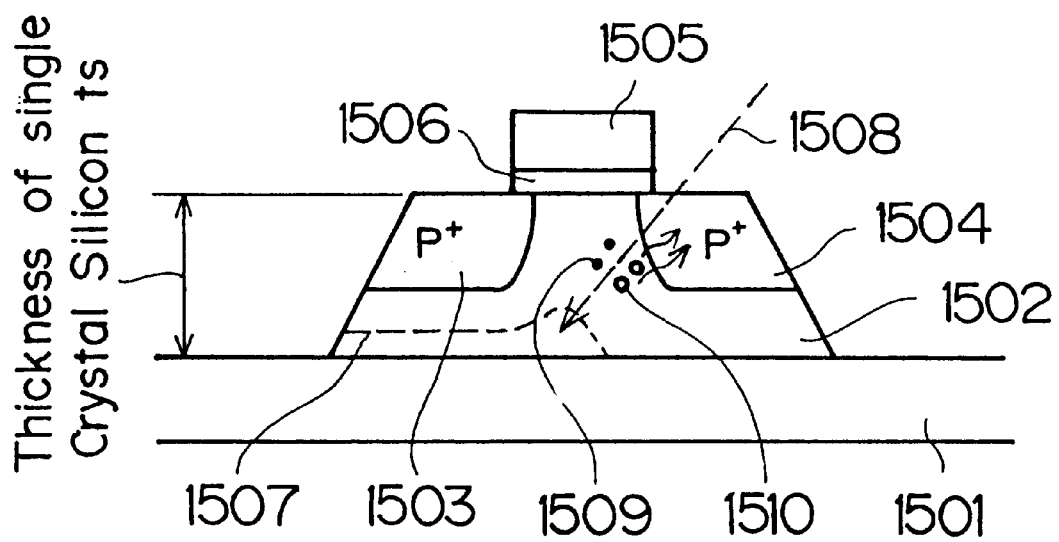
FIG. 15 is a sectional view of a MOS transistor formed on a single-crystal silicon layer on an electrical insulator when light is applied to the transistor.

FIG. 15 shows a sectional view of a pixel Sw-Tr. Symbol 1501 is a silicon oxide or quartz plate serving as an electrical insulator, 1502 is single-crystal silicon semiconductor with a thickness of 0.1 to 2 μm formed as an island on the electrical insulator 1501, 1503 and 1504 are a source and drain of a P-type MOS Tr respectively, 1505 is a gate made of Poly-Si film, and 1506 is a gate oxide made of a silicon oxide. Symbol 1507 shown by a broken line is an edge of depletion layer produced when a negative voltage is applied to the drain 1504 and gate 1505. The depletion layer is produced at the top and right side of the broken line 1507. Symbol 1508 is an incident light and 1509 and 1510 are an electron and hole produced in the depletion layer due to the incident light 1508. The hole 1510 produced due to incident light reaches a drain electrode by an electric field in the depletion layer and serves as a drain current. The electron reaches a substrate electrode if it is present nearby. However, if there is no substrate electrode nearby, the electron accumulates in the vicinity of the edge of depletion layer 1507, lowers a potential barrier between source and substrate, and creates a hole current out of a source electrode. Thus, an electron-hole pair produced due to light in the depletion layer increases leakage current and degrades transistor characteristics, and particularly decreases the ON/OFF ratio.

FIG. 14 shows a construction of a semiconductor device for a light valve serving as an active matrix arrangement. An active-matrix light valve substrate arrangement though it is omitted in FIG. 14 makes an image by forming a liquid crystal layer at the bottom of the arrangement through the silicon oxide 1401 of a pixel section comprising the pixel Sw-Tr group 1404 and pixel driving electrode group 1403, applying light vertically to the surfaces of the silicon oxide 1401 and single-crystal silicon semiconductor film 1402 from the liquid crystal layer side or pixel section side where the pixel Sw-Tr group and pixel driving electrode group are formed, and passing or interrupting the light while turning on/off each pixel Sw-Tr.

In this case, a shading film for interrupting light is formed at the top or bottom of each pixel Sw-Tr so as to prevent the light from striking against the pixel Sw-Tr as much as possible. In fact, however, light incoming from a portion with no shading film strikes against the pixel Sw-Tr.

From FIG. 15, it is found that leakage current due to incident light is generated by an electron-hole pair caused when light strikes against single-crystal silicon. Therefore, to decrease the leakage current of pixel Sw-Tr due to incident light, it is necessary to decrease the volume of single-crystal silicon of the pixel Sw-Tr section.

Figure 16:
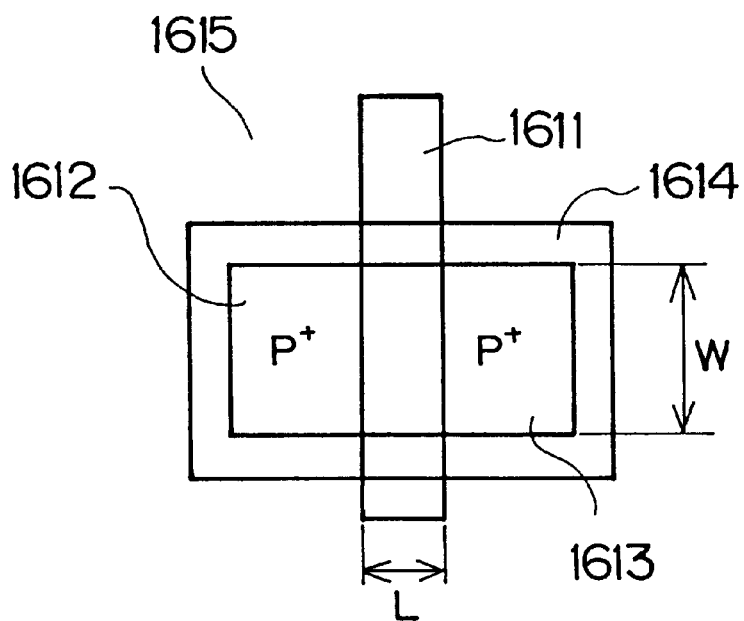
FIG. 16 is a top view of a MOS transistor formed on a single-crystal silicon layer on an electrical insulator.

FIG. 16 shows a top view of the picture element Sw-Tr in FIG. 15. Symbol 1611 is a gate made of polycrystalline silicon, 1612 and 1613 are a source and drain containing P-type impurities at a high concentration respectively, 1614 is a single-crystal silicon island, and 1615 is an electrical insulator such as silicon oxide or quartz plate under a thin single-crystal silicon layer. Symbol L is the length of the gate 1611 and W is the width of the gate.

To decrease the leak current of the pixel Sw-Tr due to light, it is necessary to decrease the area of the single-crystal silicon under the gate 1611 between the source 1612 and drain 1613, that is, decrease the product of L and W. The Vt of a MOS-Tr formed in single-crystal silicon on an electrical insulating film fluctuates when a high voltage is applied to a gate and drain, and it is therefore necessary to increase the gate length L of the pixel Sw-Tr to a certain extent as described above. Therefore, for the present invention, the gate width of the pixel Sw-Tr is minimized to decrease the area of single-crystal silicon under a gate. That is, the gate width of the pixel Sw-Tr is made equal to or smaller than the minimum gate width among the gate widths of many MOST-Tr's in a driving circuit.

Because the Tr size decreases by decreasing the gate width, the heat producing region decreases and the amount of heat to be produced also decreases even if a high voltage is applied and a large current flows.

Figure 17A:
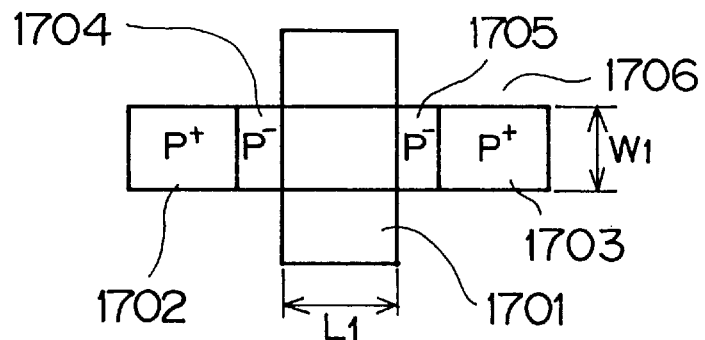
FIGS. 17(A) and 17(B) are top views of a pixel switching transistor and a MOS transistor of a driving circuit section in the semiconductor device for a light valve substrate of the present invention.
Figure 17B:
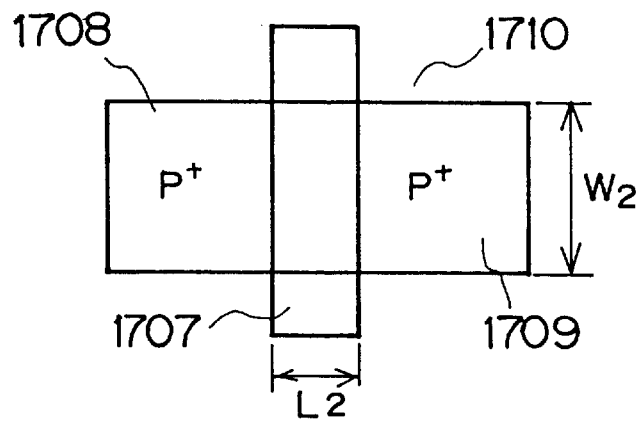

FIG. 17(A) shows a top view of the pixel Sw-Tr of the semiconductor device for a light valve substrate of the present invention and FIG. 17(B) shows a top view of the MOS Tr of the driving circuit of the present invention. In FIGS. 17(A) and 17(B), symbols 1701 and 1707 are gates made of Poly-Si, 1702 and 1708 are sources containing P-type impurities at a high concentration, 1703 and 1709 are drains containing P-type impurities at a high concentration, 1704 and 1705 are a source and drain containing P-type impurities at a relatively low concentration respectively, and 1706 and 1710 are electrical insulators made of a silicon oxide film or quartz plate under single-crystal silicon.

The pixel Sw-Tr in FIG. 17(A) is a P-type MOS Tr having the LDD structure and the MOS Tr in FIG. 17(B) is a Tr having the minimum gate length and width among the gate lengths and widths of many MOST Tr's in a driving circuit.

In FIGS. 17(A) and 17(B), symbols L1 and W1 are the gate length and width of the pixel Sw-Tr respectively and L2 and W2 are the gate length and width of the MOS Tr in the driving circuit respectively. In this case, it is essential that L1 is larger than L2 and W1 is smaller than W2. For example, if the minimum design rule is set to 2 $\mu$m, L2 is set to 2 $\mu$m, W2 to 10 $\mu$m, L1 to 4 $\mu$m, and W1 to 2.5 $\mu$m. Thus, even if a high voltage is applied to the gate and drain of the pixel Sw-Tr, the Vt hardly changes with time and the leakage current caused by incident light can be minimized by setting the gate length and width to the above values and applying the LDD structure to the pixel Sw-Tr.

Figure 1:
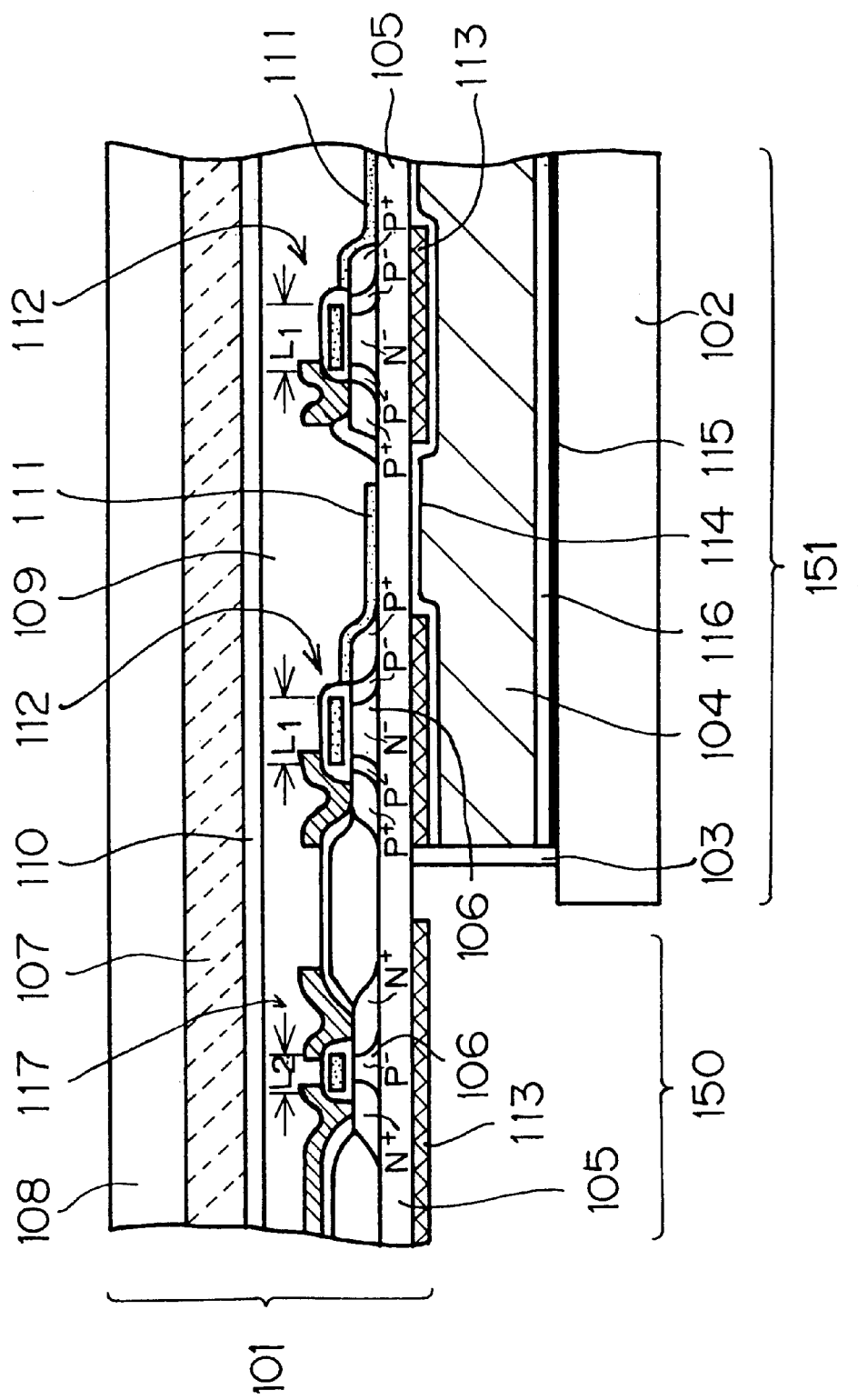
FIG. 1 is a sectional view of a semiconductor device used for a light valve substrate of the present invention.
Figure 2:
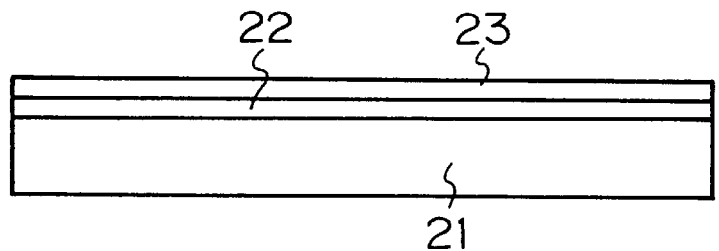
FIG. 2 is a sectional view of an SOI wafer.
Figure 3:
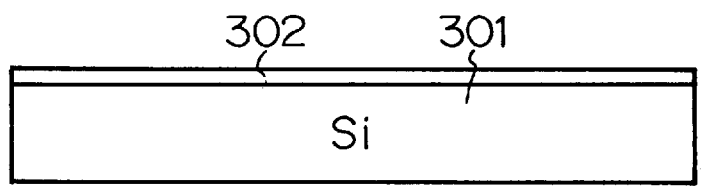
FIGS. 3(a) to 3(d) are sectional views of the steps of fabricating a conventional semiconductor device.
Figure 3:
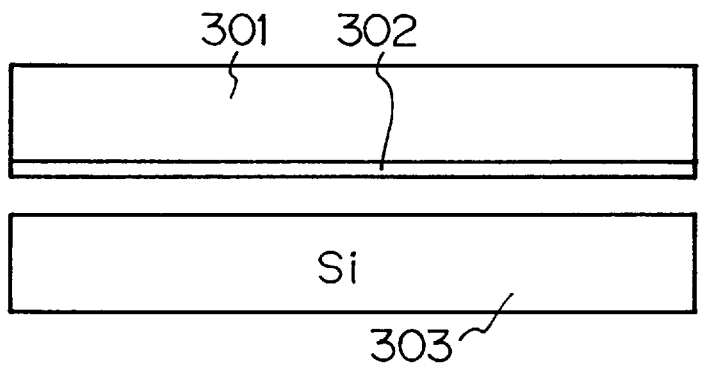
Figure 3:
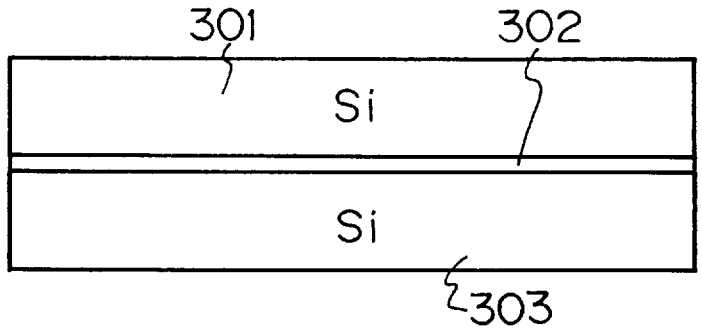
Figure 3:
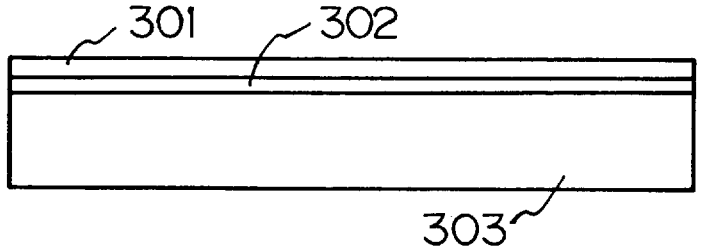
Figure 4:
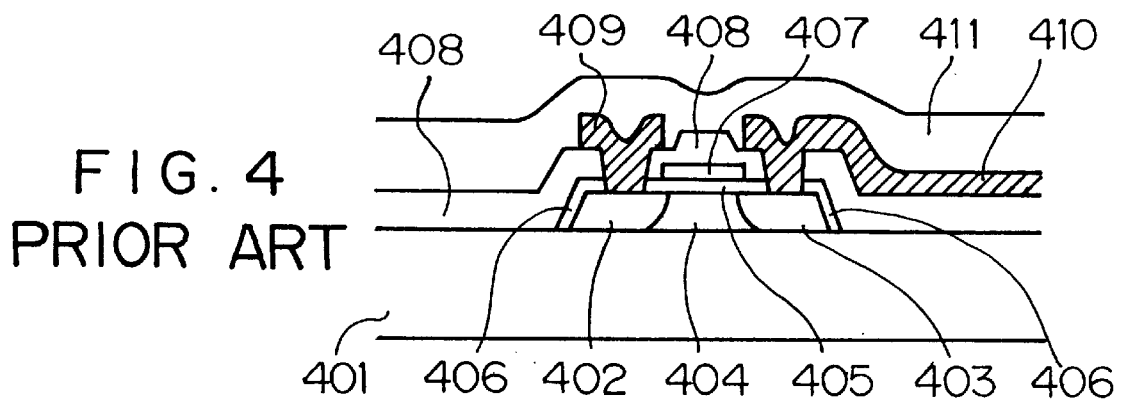
FIG. 4 is a sectional view of a conventional semiconductor device.
Figure 5:
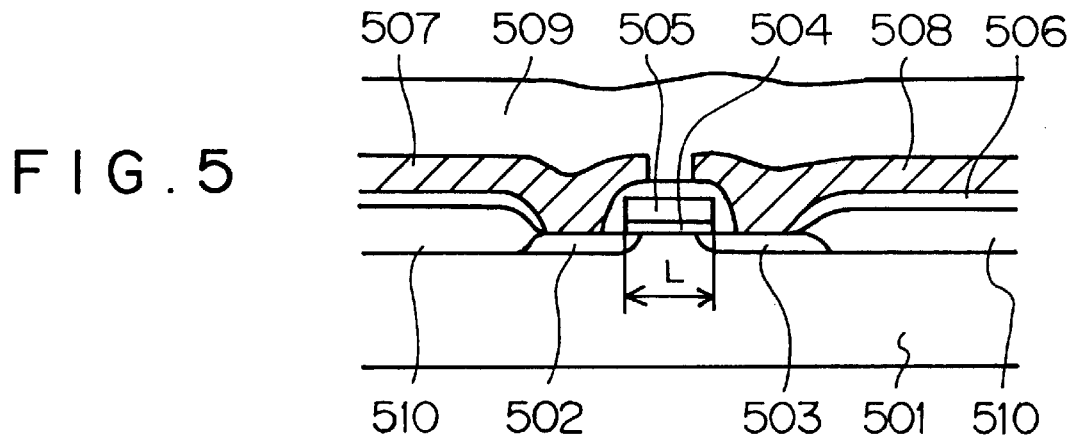
FIG. 5 is a sectional view of a MOS transistor formed in a single-crystal silicon layer.
Figure 6:
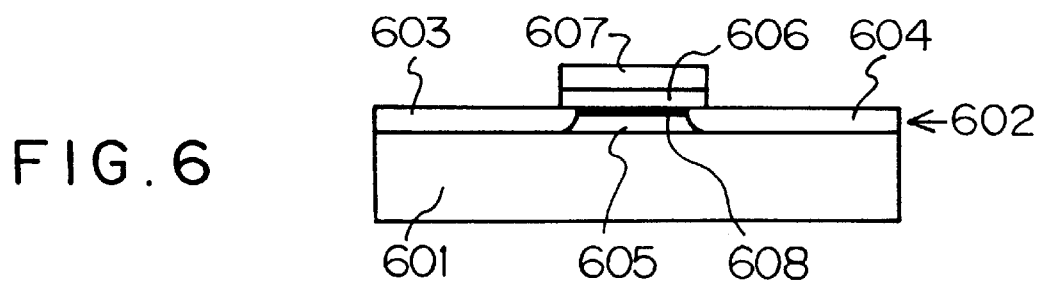
FIG. 6 is a sectional view of a MOS transistor formed a single-crystal silicon layer on a quartz substrate.

FIG. 1 shows an embodiment of a light valve device using the or device of the present invention as a driving substrate, and more particularly shows an active matrix liquid-crystal light valve device. The light valve device has a structure in which a driving substrate 101 comprising the semiconductor device of the present invention and a facing substrate 102 made of transparent glass are bonded to each other through a spacer 103 and liquid crystal 104 serving as an electrooptical material is sealed between the both substrates. The driving substrate 101 has a structure in which an integrated circuit formed on a single-crystal silicon layer 106 formed on an electrical insulator 105 is copied to a holding member 108 by an adhesive layer 107. A silicon oxynitride film or silicon nitride film 110 is formed on the top layer of a passivation film 109 for protecting the integrated circuit. The passivation film 109 effectively protects the integrated circuit from moisture and hydrogen contained in the adhesive layer 107. Therefore, electrical characteristics can be prevented from degrading. The driving substrate 101 is divided into a peripheral driver circuit section 150 and a pixel section 151. A plurality of electrodes 111 are arranged as a matrix and pixel Sw-Tr 112 for driving the respective pixel electrodes 111 are integrally formed on the pixel section 151. The peripheral driver circuit section 150 is covered with a shading film 113 from the back. Each respective pixel Sw-Tr is also covered with the shading film 113 from the back.

A liquid crystal alignment layer 114 is formed at the back of the picture element section 151 of the driving substrate 101. A common electrode 115 and liquid crystal alignment layer 116 are formed on the inner surface of the facing substrate 102. Though the pixel Sw-Tr 112 uses a P-type MOS Tr having the LDD structure as shown in FIG. 1, it can also use an N-type MOS Tr having the LDD structure. In FIG. 1, an N-type MOS Tr 117 is shown at the driving circuit section 150. Though the driving circuit section 150 includes many N- and P-type MOS Tr's, the N-type MOS Tr 117 shown in FIG. 1 is a Tr having the minimum gate length among those MOS Tr's. The gate length of the N-type MOS Tr's in the driving circuit section 150 is L2 and that of the P-type MOS Tr's in the driving circuit section 150 is L1. L1 is larger than L2. Thus, it is possible to reduce the Vt fluctuation of the pixel Sw-Tr to which a high voltage is applied.

Though not illustrated in FIG. 1, the gate width W1 of the picture element Sw-Tr 112 is made smaller than the minimum gate width W2 among the gate widths of the many MOS Tr's integrated in the driving circuit section 150. Thus, the leakage current of the pixel Sw-Tr caused by incident light becomes very small.

The following is a description of an embodiment of the present invention for solving the above-noted problem (3).

Figure 18:
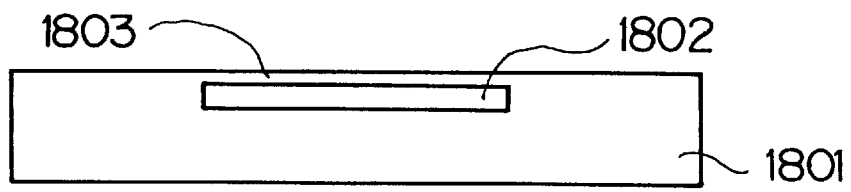
FIG. 18 is a sectional view of the semiconductor device of the present invention.

FIG. 18 shows an embodiment of the present invention. Symbol 1801 is a single-crystal silicon substrate, 1802 is a silicon oxide embedded in the single-crystal silicon substrate 1801 and serving as an electrical insulator, and 1803 is a thin single-crystal silicon layer on the silicon oxide 1802.

The silicon oxide 1802 has a thickness of several hundred angstroms to several microns and the thin single-crystal silicon layer 1803 also has a thickness of several hundred angstroms to several microns.

Figure 19:
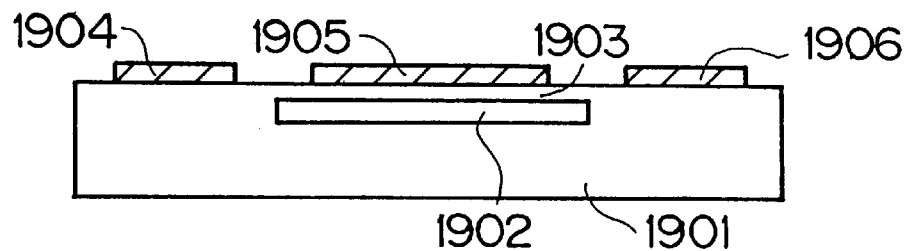
FIG. 19 is a sectional of the semiconductor device of the present invention.

FIG. 19 shows another embodiment of the present invention. Symbol 1901 is a single-crystal silicon substrate, 1902 is an electrical insulator with a thickness of several hundred angstroms to several microns embedded in the single-crystal silicon substrate 1901, and 1903 is a thin single-crystal silicon layer with a thickness of several hundred angstroms to several microns on the silicon oxide 1902.

Symbol 1904 is a circuit 1 formed in a region at the left of the single-crystal silicon substrate 1901 and where no electrical insulator is embedded, 1906 is a circuit 3 in a region at the right of the single-crystal silicon substrate and where no electrical insulator is embedded, and 1905 is a circuit 2 formed on a thin single-crystal silicon layer above the electrical insulator 1902. The circuits 1904, 1905, and 1906 are electrically connected to each other to form an integrated circuit having a function. The circuit 1 of 1904 and the circuit 3 of 1906 have a high operation frequency and therefore, they have a large power consumption. However, there is no electrical insulator under the circuit 1 of 1904 or circuit 3 of 1906. Therefore, produced heat is released to the thick semiconductive single-crystal silicon substrate 1901 with a thickness of over hundred microns under the circuit 1 of 1904 and the circuit 3 of 1906. Therefore, a stable circuit is obtained because no carrier trap level is generated due to temperature rise in a gate insulating film of a MIS transistor and a transistor group constituting the circuit 1 of 1904 and the circuit 3 of 1906 have a high reliability.

The circuit 2 of 1905 formed on a thin single-crystal silicon layer 1903 has a low operation frequency and a small power consumption, and hardly produces heat. Therefore, no heat is accumulated in the single-crystal silicon layer 1903 even if the electrical insulating film 1902 is present under the thin single-crystal silicon layer 1903. When a high operation speed is required for the circuit 2 of 1905, it can be easily obtained because the circuit 2 of 1905 is formed on an SOI from which the high operation speed of the circuit can be obtained.

Figure 20:
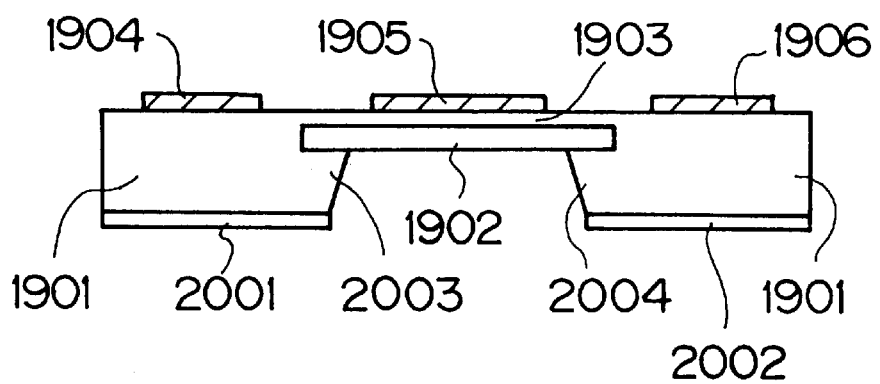
FIG. 20 is a sectional of the semiconductor device of the present invention.

FIG. 20 shows still another embodiment of the present invention. The embodiment of the present invention shown in FIG. 20 is similar to the embodiment of the present invention shown in FIG. 19. Therefore, descriptions of the elements 1901 to 1906 common to those in FIG. 19 are omitted.

In FIG. 20, part of the single-crystal silicon is removed from the silicon oxide 1902 serving as an electrical insulator embedded in part of the region of the single-crystal silicon substrate 1901. Symbols 2001 and 2002 are silicon nitride films which serve as masks for removing the single-crystal silicon under the silicon oxide 1902. To remove the single-crystal silicon, it is necessary to immerse the single-crystal silicon substrate in a potassium hydroxide solution (KOH solution) heated to, for example, 80 to 100° C. The silicon oxide 1902 serves as a stopper when etching single-crystal silicon with the KOH solution and also prevents the thin single-crystal silicon film 1903 on the silicon oxide 1902 from being etched. After removing the single-crystal silicon under the silicon oxide 1902, it is optional whether to remove the silicon nitride films 2001 and 2002. Symbols 2003 and 2004 are portions where some of the single-crystal silicon 1901 is left under the silicon oxide 1902.

Figure 21:
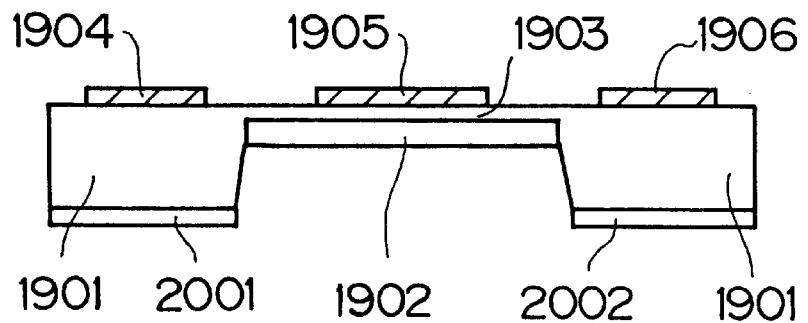
FIG. 21 is a sectional view of the semiconductor device of the of the present invention.

FIG. 21 shows still another embodiment of the present invention. The embodiment of the present invention shown in FIG. 21 is similar to the embodiments of the present invention shown in FIGS. 19 and 20. Therefore, descriptions of the elements 1901 to 1906 and 2001 and 2002 common to those in FIGS. 19 and 20 are omitted.

The embodiment in FIG. 21 is different from the embodiment in FIG. 20 only in the fact that symbols 2003 and 2004 which are a part of the single-crystal silicon 1901 respectively are absent under the silicon oxide 1902 shown in FIG. 20. That is, FIG. 21 shows a structure in which the single-crystal silicon 1901 under the silicon oxide 1902 is entirely removed.

The embodiment of the present invention in FIG. 21 has a structure in which any other arrangement can be easily set to the portion from which the single-crystal silicon 1901 under the silicon oxide 1902 is removed because-the portion is larger than that of the embodiment of the present invention in FIG. 20.

Figure 22:
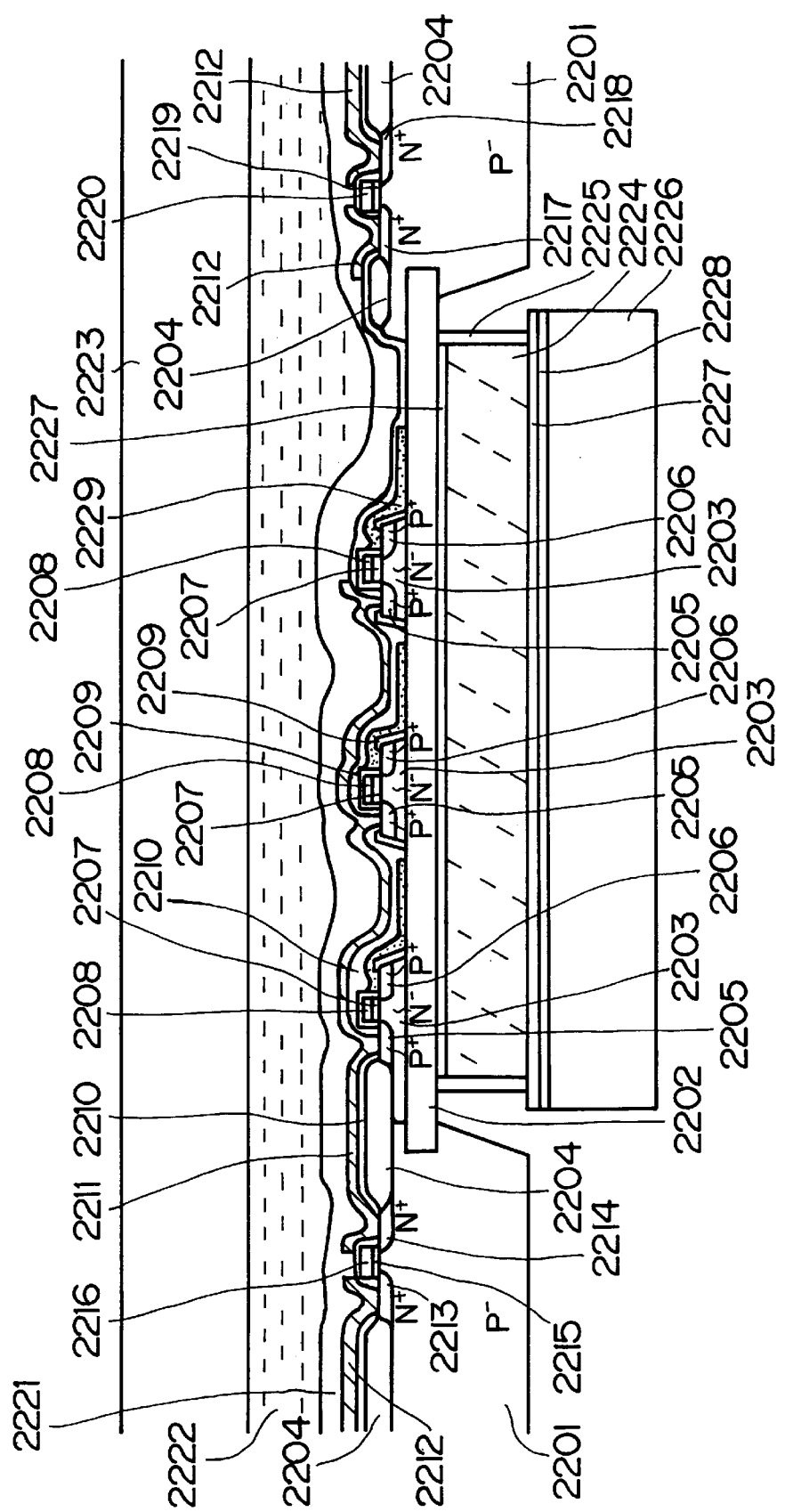
FIG. 22 is a sectional view of the semiconductor device of the present invention.

FIG. 22 shows a sectional view of an active-matrix light-valve device serving as the semiconductor device of the present invention. The semiconductor device of the present invention has a structure in which a transparent substrate 2223 is bonded to the semiconductor device shown in FIG. 20 by adhesive and a facing substrate 2226 is set under a silicon oxide 2202 so that the liquid crystal layer 2224 is put between the substrate 2226 and the silicon oxide 2202. The following is the description of each portion in FIG. 22.

Symbol 2201 is a single-crystal silicon substrate containing P-type impurities at a low concentration (e.g. approx. $1 \times 10^{16}$ cm$^{-3}$), which is present at the right and left of FIG. 22. A silicon oxide 2202 with a thickness of several hundred angstroms to several microns serving as an electrical insulator film is present at the center of FIG. 22 and three islands of single-crystal silicon 2203 containing N-type impurities at a low concentration (e.g. approx. $1 \times 10^{16}$ cm$^{-3}$) are arranged in the lateral direction.

In FIG. 22, it is shown that three islands of a single-crystal silicon layer are arranged and a MOS Tr is formed on each island. However in fact, over ten to thousands of islands are arranged.

Symbol 2204 is a field oxide made of a silicon oxide with a thickness of over thousand Angstroms for isolating device formed on the single-crystal silicon substrate 2201.

A MOS Tr is formed on each of three islands of a thin single-crystal silicon layer on the silicon oxide 2202. Each MOS Tr serves as a switching transistor in each pixel section of an active-matrix arrangement. Each of three switching transistors comprises a thin single-crystal silicon 2203 with a thickness of one hundred angstroms to several microns containing N-type impurities at a low concentration, a drain 2205 and source 2206 containing P-type impurities at a high concentration (e.g. approx. $1 \times 10^{20}$ cm$^{-3}$), a gate insulator 2207, and a gate 2208.

Symbol 2209 is an insulating film for preventing electrical continuity between a transparent pixel electrode 2229 made of a thin Poly-Si film with a thickness of one hundred to 2,000 angstroms and a thin single-crystal silicon layer 2203. The insulating film 2209 is a silicon oxide with a thickness of one hundred to 1,000 angstroms deposited by chemical vapor deposition. Symbol 2210 is an intermediate insulating film made of a silicon oxide for preventing electrical continuity between a drain wire 2211 made of a metal such as aluminum or the like and gate electrode 2208, and between a the drain wire 2211 and transparent pixel electrode 2229.

An N-type MOS Tr is present on the single-crystal silicon substrate 2201 at the left of FIG. 22. The N-type MOS Tr comprises a source 2213 and drain 2214 containing N-type impurities at a high concentration (approx. $1 \times 10^{20}$ cm$^{-3}$), a gate insulator 2215, gate electrode 2216, and single-crystal silicon substrate 2201 containing P-type impurities. The drain wire 2211 made of a metal such as aluminum or the like connected with the drain 2214 of the N-type MOS Tr connects with each drain 2205 of three pixel Sw-Tr's made of a P-type MOS Tr on the silicon oxide 2202 and supplies a voltage to give electric charges to the transparent pixel electrode 2229. That is, the N-type MOS Tr serves as a part of a driving circuit for driving the pixel Sw-Tr and the driving circuit is formed on the single-crystal silicon substrate 2201.

Moreover, an N-type MOS Tr is present on a single-crystal silicon substrate at the right of FIG. 22. The N-type MOS Tr comprises a source 2217 and drain 2218 containing N-type impurities at a high concentration (e.g. approx. $1 \times 10^{20}$ cm$^{-3}$), a gate insulator 2219, a gate electrode 2220, and a single-crystal silicon substrate 2201 containing P-type impurities. The source 2217 and drain 2218 of the N-type MOS Tr connect with a metallic wire 2212 made of aluminum or the like.

Each N-type MOS Tr on a single-crystal silicon substrate at the right and left of FIG. 22 and three P-type MOS Tr's serving as pixel Sw-Tr's on the silicon oxide 2202 at the center of FIG. 22 are finally electrically connected to each other at a not-illustrated portion to constitute an integrated circuit having a certain function. Symbol 2221 is a passivation film made of a silicon nitride film for covering the entire integrated circuit. Symbol 2223 is a transparent substrate made of quartz with a thickness of one hundred to 1,000 microns, which is bonded to the single-crystal silicon substrate 2201 by an adhesive 2222.

For the semiconductor device of the present invention in FIG. 22, the liquid crystal layer 2224 is sealed in a region enclosed by a sealing material 2225 and facing transparent substrate 2226 under the silicon oxide 2202. A liquid crystal alignment layer 2227 for orienting liquid crystal is formed at a portion contacting the liquid crystal layer at the bottom of the silicon oxide 2202 on the facing transparent substrate 2226. Moreover, a common electrode 2228 made of ITO or the like is formed on the facing transparent substrate 2226.

In FIG. 22, the optically-opaque drain wire 2211 made of aluminum is arranged on three pixel Sw-Tr's. However, because the width of the aluminum wire is as small as several microns, the drain wire 2211 made of aluminum cannot be seen when drawing a sectional view slightly back or slightly forward of the sectional view in FIG. 22. In this case, because a silicon oxide and thin polysilicon film are transparent, the top and bottom of the transparent pixel electrode 2229 become entirely transparent. Therefore, whenever each pixel Sw-Tr is turned on/off, a voltage is applied or not applied between each transparent pixel electrode 2229 and common electrode 2228, that is, to the liquid crystal layer under each pixel electrode. As a result, the light of a lamp set under the facing transparent electrode 2226, for example, passes through a portion where each pixel Sw-Tr is turned on but the light is interrupted at a portion where it is turned off and a picture is displayed.

Therefore, for the semiconductor device of the present invention in FIG. 22, a pixel Sw-Tr group is formed on the optically transparent silicon oxide film 2202, the optically-opaque single-crystal silicon under the silicon oxide film 2202 is removed, and a liquid crystal is set to the portion where the silicon oxide 2202 is removed. Thus, the semiconductor device.-can be used as a light valve substrate device.

Moreover, because the driving circuit section with a high operation frequency for driving the pixel Sw-Tr group is formed on the single-crystal silicon substrate 2201, the heat produced due to the operation of the driving circuit is easily released to the single-crystal silicon substrate 2201. Therefore, carrier trap levels do not-increase due to temperature rise in many MOS Tr's constituting the driving circuit. Thus, there is an excellent advantage that the driving circuit operates stably.

Figure 23:
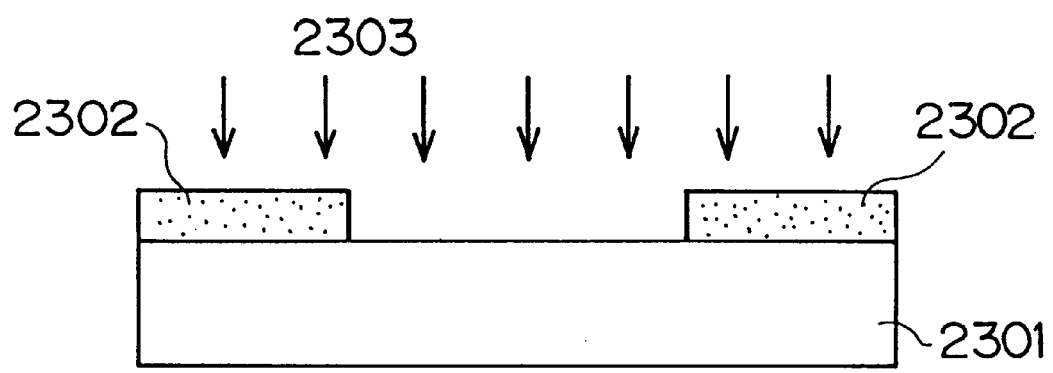
FIG. 23 is a sectional view showing a method for fabricating the semiconductor device of the present invention.

FIG. 23 is a sectional view showing a method for fabricating the semiconductor device of the present invention. Symbol 2301 is a single-crystal silicon substrate and 2302 is resist with a thickness of several microns. A window is opened on the resist 2302 at the center of the single-crystal silicon substrate 2301 to implant oxygen ions 2303 oxygen ions are implanted at a proper acceleration energy so that a single-crystal silicon layer with a desired depth is left on the single-crystal silicon surface. Then, implanted oxygen ions react with the silicon by heating the single-crystal silicon substrate 2301 at a temperature of 1,000° C. or higher and a silicon oxide is formed, and thereby the semiconductor device of the present invention is formed.

Another embodiment of the present invention shown in FIG. 18 for the problem (3) is described below.

Figure 24:
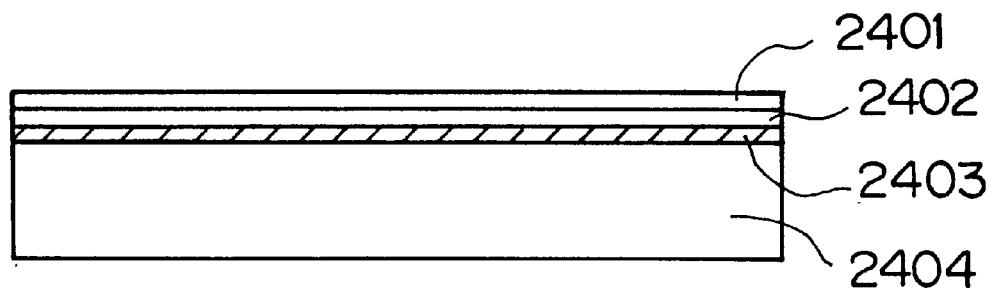
FIG. 24 is a sectional view of the semiconductor device of the present invention.

FIG. 24 shows a sectional view of the semiconductor device of the present invention. Symbol 2401 is a thin single-crystal silicon layer, 2402 is a silicon oxide, 2403 is an aluminum nitride layer, and 2404 is a single-crystal silicon substrate with a thickness of several hundred to 1,000 $\mu$m. The thin single-crystal silicon layer 2401, silicon oxide 2402, and aluminum nitride layer 2403 have a thickness of over one hundred angstroms.

When an integrated circuit formed on the thin single-crystal silicon layer 2401 operates, the heat produced in the thin single-crystal silicon layer 2401 passes through the silicon oxide 2402 because the aluminum nitride layer 2403 with a high heat conductivity, and then it is transmitted to the aluminum nitride layer 2403, and finally released to the thick single-crystal silicon substrate 2404 serving as a heat sink.

This effect becomes more remarkable when the thickness of the silicon oxide is smaller than that of the aluminum nitride layer 2403, in other words, when the thickness of the silicon oxide 2402 ranges from several hundred to over one thousand angstroms and the thickness of the aluminum nitride layer 2403 ranges from 1 to several $\mu$m.

The heat conductivities of a silicon oxide, aluminum nitride and single-crystal silicon are 0.014 W/cm·°K., 2.5 W/cm·°K., and 1.5 W/cm·°K. respectively.

Therefore, the heat conductivity of aluminum nitride is approx. 180 times as large as that of the silicon oxide film, and is larger than that of single-crystal silicon. Thus, it is found that aluminum nitride has an excellent heat conductive characteristic.

As shown in FIG. 24, for the semiconductor device of the present invention, the silicon oxide 2402 is present just under the thin single-crystal silicon layer 2401 on which an integrated circuit is formed. This is not only because a silicon oxide is stable as an insulator and has a high reliability but because the silicon oxide is the best insulating film as an insulating film not affecting the single-crystal silicon layer when considering an insulating film contacting single-crystal silicon.

Figure 25:
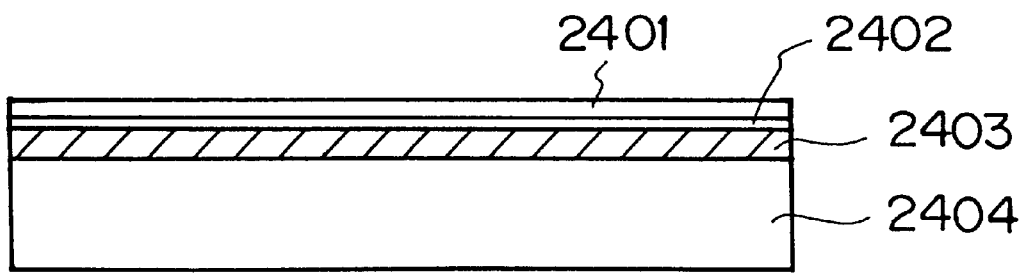
FIG. 25 is a sectional view of the semiconductor device of the present invention.

FIG. 25 shows a sectional view of the semiconductor device of another embodiment of the present invention. The number and name of each element in FIG. 25 is the same as that of each element in FIG. 24. Therefore, descriptions of them are omitted for simplification. Similarly, when the same number is used in other drawings, the name of the element corresponding to the number is the same as the name already described. Therefore, the description of it is hereafter omitted.

FIG. 25 is different from FIG. 24 only in the fact that the thickness of the aluminum nitride layer 2403 is larger than that of the silicon oxide 2402. By making the thickness of the layer 2403 larger than that of the film 2402, the heat produced in the thin single-crystal silicon layer 2401 very easily passes through the thin silicon oxide 2402 and easily reaches the aluminum nitride layer 2403 with a high heat conductivity when the integrated circuit formed on the thin single-crystal silicon layer 2401 operates as described above. As a result, the heat described above easily reaches the thick silicon substrate 2404 serving as a heat sink to prevent the temperature of the thin single-crystal silicon layer 2401 from rising.

Figure 26:
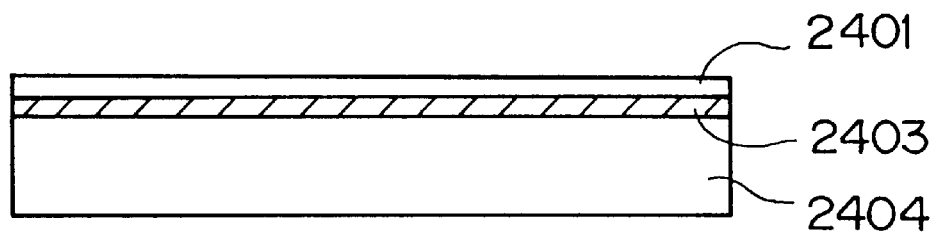
FIG. 26 is a sectional view of the semiconductor device of the present invention.

FIG. 26 is a sectional view of still another embodiment of the semiconductor device of the present invention. For the embodiment in FIG. 26, only the aluminum nitride layer 2403 is present as an insulating film under the thin single-crystal silicon layer 2401 serving as an SOI. In this case, the heat produced due to the operation of the integrated circuit formed on the thin single-crystal silicon layer 2401 is directly transmitted to the aluminum nitride layer 2403 with a high heat conductivity and easily released to the single-crystal silicon substrate serving as a heat sink.

Figure 27:
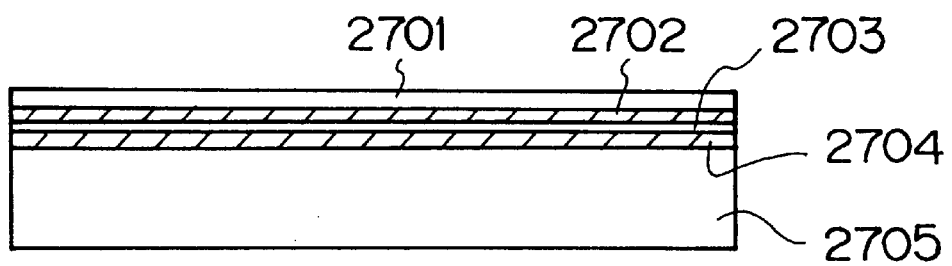
FIG. 27 is a sectional view of the semiconductor device of the present invention.

FIG. 27 is a sectional view of still another embodiment of the semiconductor device of the present invention. Symbol 2701 is a thin single-crystal silicon layer, 2702 and 2704 are aluminum nitride layers, 2703 is a silicon oxide, and 2705 is a thick single-crystal silicon substrate.

For the embodiment of the present invention in FIG. 27, an insulating film under the thin single-crystal silicon layer 2701 serving as an SOI layer has a three-layer structure in which the silicon oxide 2703 is formed between the aluminum nitride layers 2702 and 2704. For the structure in FIG. 27, the aluminum nitride layer with a high heat conductivity contacts both the thin single-silicon layer 2701 and thick single-crystal silicon substrate 2705 and the heat produced due to the operation of the integrated circuit formed the thin single-crystal silicon layer is easily released to the thick single-crystal silicon substrate 2705 serving as a heat sink.

Figure 28A:
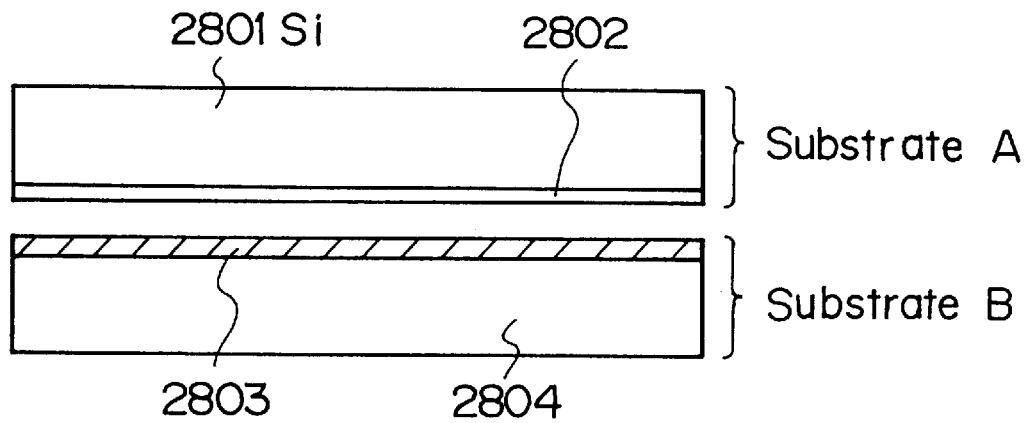
FIGS. 28(a) to 28(c) are sectional views of the steps of fabricating the semiconductor device of the present invention.
Figure 28B:
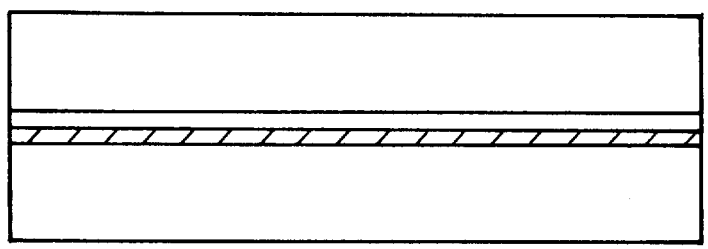
Figure 28C:
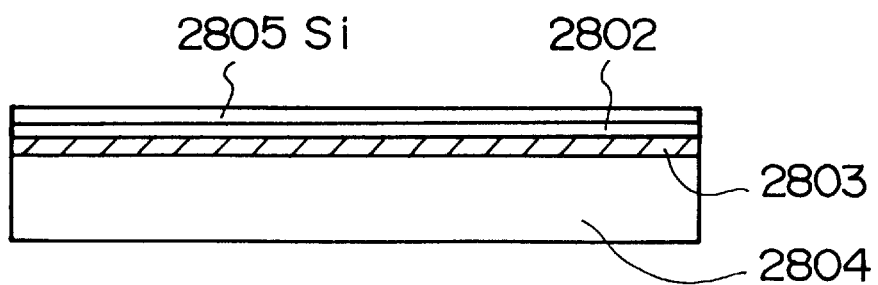

FIGS. 28(a) to 28(c) are sectional views of the steps showing a fabrication method of the semiconductor device of the present invention. The fabrication method in FIGS. 28(a) to 28(c) uses an SOI wafer forming method according to the bonding method.

In FIG. 28(a), symbol 2801 is a single-crystal silicon substrate and 2802 is a silicon oxide obtained by oxidizing the single-crystal silicon substrate 2801. The silicon oxide 2802 has a thickness of several hundred angstroms to several $\mu$m. The single-crystal silicon substrate 2801 on which the silicon oxide 2802 is formed is referred to as substrate A. Symbol 2804 is another single-crystal silicon substrate and 2803 is an aluminum nitride layer formed on the surface of the single-crystal silicon substrate 2804. The single-crystal silicon substrate 2804 on which the aluminum nitride layer 2803 is formed is referred to as substrate B.

In FIG. 28(b), the substrate A is bonded with the substrate B in a high-temperature vacuum or a high-temperature oxygen atmosphere of 900 to 1,200° C. so that the silicon oxide 2802 faces the aluminum nitride layer 2803.

Moreover, in FIG. 28(c), the single-crystal silicon substrate 2801 on which the silicon oxide 2802 is formed is removed up to a desired thickness through grinding and/or etching. As a result, the thin single-crystal silicon layer 2805 serving as an SOI layer is formed on the aluminum nitride layer 2803 and silicon oxide 2802. The silicon oxide 2802 formed by oxidizing the single-crystal silicon substrate 2801 is present just under the thin single-crystal silicon layer 2805 serving as an SOI layer on which an integrated circuit is formed and the boundary between the single-crystal silicon layer 2805 and silicon oxide 2802 is kept in a preferable state.

Figure 29:
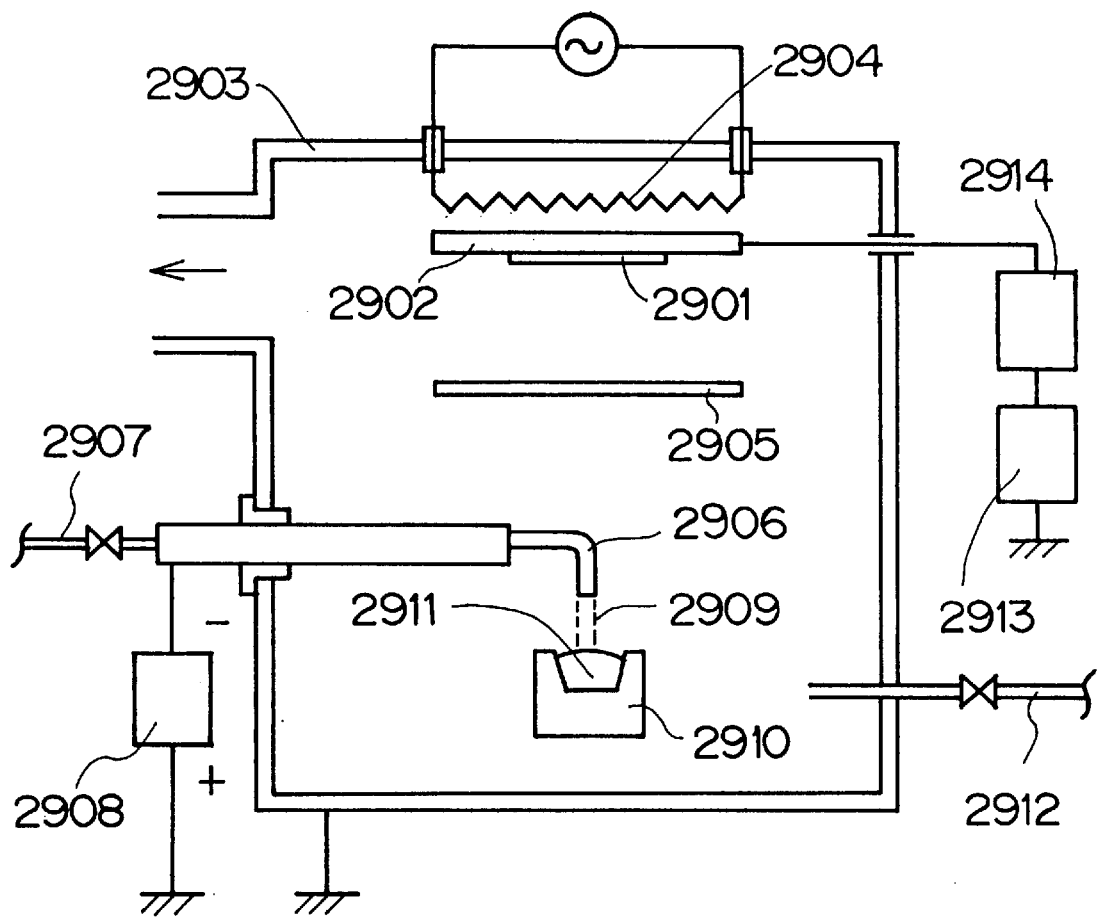
FIG. 29 is a schematic view of an arrangement for forming aluminum nitride.

FIG. 29 is a schematic view of an arrangement for forming an aluminum nitride layer. A method for forming an aluminum nitride layer above a single-crystal silicon substrate through the ion plating method is described below with reference to FIG. 29.

A single-crystal silicon substrate 2901 is attached to a substrate holder 2902. A vacuum vessel 2903 is brought into a high vacuum state of, for example, 0.01 m Torr or lower. The temperature of the vacuum vessel 2903 is raised to, for example, 300 to 400° C. by a heater 2904 to exhaust unnecessary gas out of the single-crystal silicon substrate 2901, substrate holder 2902, and vacuum vessel 2903 (degassing). The degassing increases the adhesion of aluminum nitride to be adhered to the single-crystal silicon substrate.

Then, argon gas is supplied to a hollow cathode 2906 through an argon gas introduction tube 2907 while keeping a shutter 2905 closed. A hollow-cathode power supply 2908 is turned on to start hollow-cathode discharge. As a result, aluminum 2911 in a crucible 2910 is heated. The heated aluminum evaporates. The discharge current by the hollow cathode is, for example, 200 A and the argon gas flow rate is 18 SCCM (18 CC per mm). Nitrogen gas $N_2$ is introduced through a gas introduction port 2912 to adjust the nitrogen partial pressure. The nitrogen partial pressure is, for example, 2 m Torr.

After the discharge by the hollow cathode and the nitrogen gas pressure are stabilized, the shutter 2905 is opened to form an aluminum nitride layer on the single-crystal silicon substrate 2901. While the aluminum nitride layer is formed, a high-frequency bias is applied to the single-crystal silicon substrate 2901 from a high-frequency power supply 2913 and an impedance matching box 2914. The high-frequency bias removes charges from the substrate and therefore, an aluminum nitride film which is a compound film superior in adhesiveness and crystallinity can be formed on the single-crystal silicon substrate. In this case, the high-frequency output is, for example, 20 W.

The aluminum nitride manufacturing method of the present invention described above is called the ion plating method and also called the actuation reaction evaporation method (ARE method).

Figure 30:
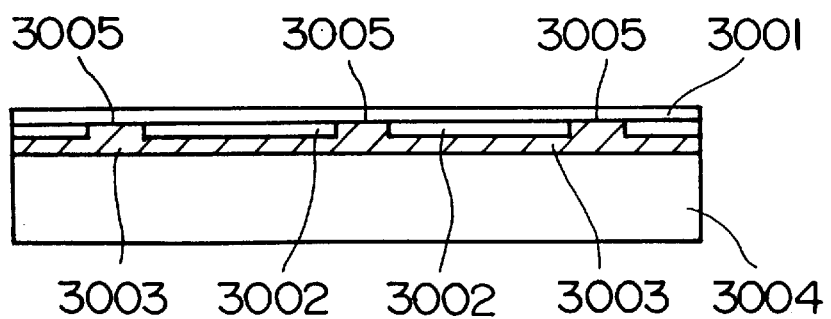
FIG. 30 is a sectional view of the semiconductor device of the present invention.

FIG. 30 shows a sectional view of still another embodiment of the present invention. Symbol 3001 is a thin silicon oxide film serving as an SOI layer, 3002 is a silicon oxide, 3003 is an aluminum nitride layer, and 3004 is a thick single-crystal silicon film.

In FIG. 30, the silicon oxide 3002 is removed from a portion 3005 in a silicon wafer and the aluminum nitride layer contacts the thin single-crystal silicon layer 3001 at the portion 3005. For this structure, the heat produced in the thin single-crystal silicon due to the operation of an integrated circuit formed on the thin single-crystal silicon layer 3001 is transmitted to the aluminum nitride layer 3003 with a high heat conductivity from the portion 3005 where the aluminum nitride layer 3003 directly contacts the thin single-crystal silicon 3001, and is released to the single-crystal silicon substrate 3004 serving as a heat sink. Therefore, for the semiconductor device of the present invention shown in FIG. 30, the temperature of the thin single-crystal silicon layer 3001 is prevented from rising even while the integrated circuit operates.

A method for fabricating the semiconductor device of the present invention is described below with reference to the sectional views of steps in FIGS. 31(a) to 31(d) and FIGS. 32(a) to 32(d).

Figure 31A:
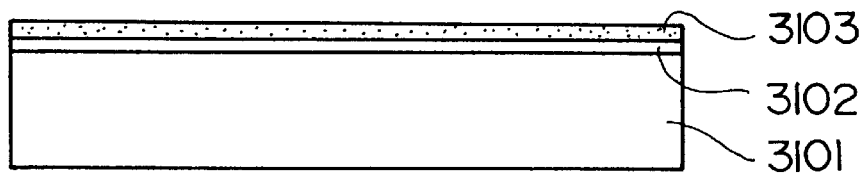
FIGS. 31(a) to 31(d) are sectional views of the steps of fabricating the semiconductor device of the present invention.

In FIG. 31(a), symbol 3101 is a single-crystal silicon substrate, 3102 is a silicon oxide obtained by oxidizing the single-crystal silicon substrate, and 3103 is a resist film applied onto the silicon oxide.

Figure 31B:
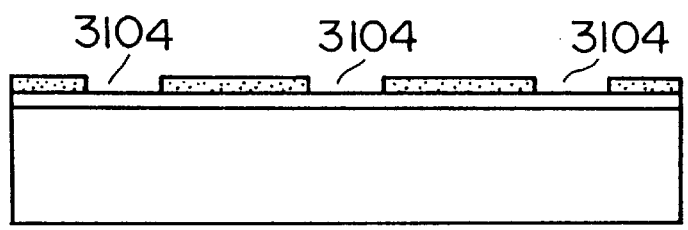

In FIG. 31(b), a resist window 3104 is formed in a portion of the resist film 3103 through the step of photolithography. Thereafter, the silicon oxide in the portion with the resist window 3104 formed thereover is etched through ion etching.

Figure 31C:
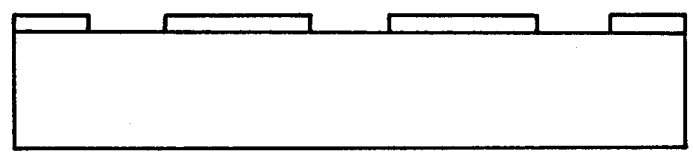

In FIG. 31(c), a portion of the silicon oxide is etched and the surface of the single-crystal silicon substrate is exposed at the portion.

Figure 31D:
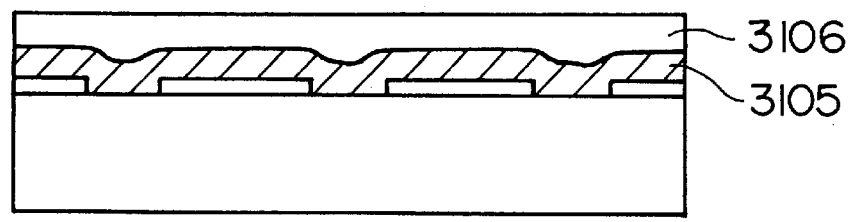

In FIG. 31(d), the aluminum nitride layer 3105 is formed on the single-crystal silicon substrate in which the silicon oxide is left at a portion of the surface. Moreover, the silicon oxide 3106 formed through chemical vapor deposition is deposited on the layer 3105. In this case, the surface of the aluminum nitride layer 3105 is not flat but the surface of the thickly-deposited silicon oxide 3106 is flat.

Figure 32A:
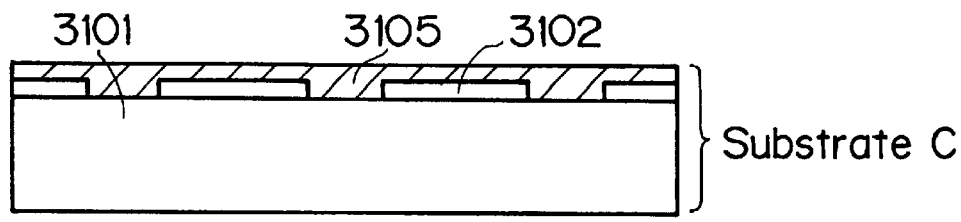
FIGS. 32(a) to 32(d) are sectional views of the steps of fabricating the semiconductor device of the present invention.

In FIG. 32(a), when the entire silicon oxide film 3106 formed through chemical vapor deposition and a portion of the aluminum nitride layer 3105 are removed by grinding or polishing, the aluminum nitride layer 3105 is left with a very flat surface. Thus, the single-crystal silicon substrate 3101 on which the silicon oxide 3102 and very-flat aluminum nitride layer 3105 are formed is referred to as substrate C.

Figure 32B:
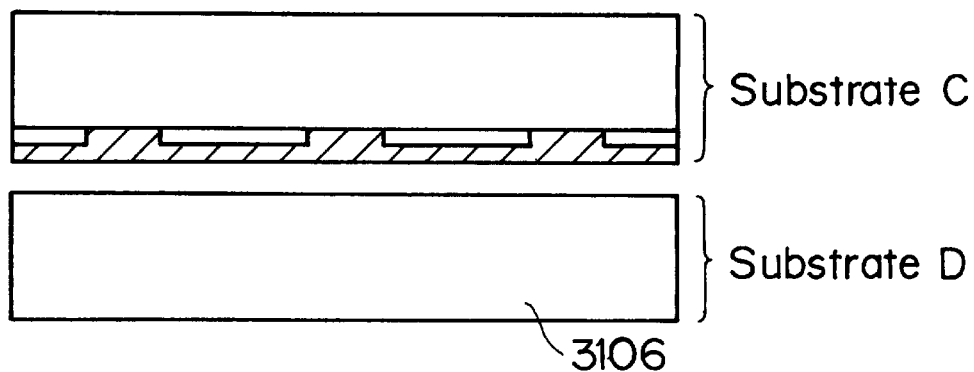

In FIG. 32(b), the substrate C and a new single-crystal silicon substrate 3106 are prepared (this is referred to as substrate D).

Figure 32C:
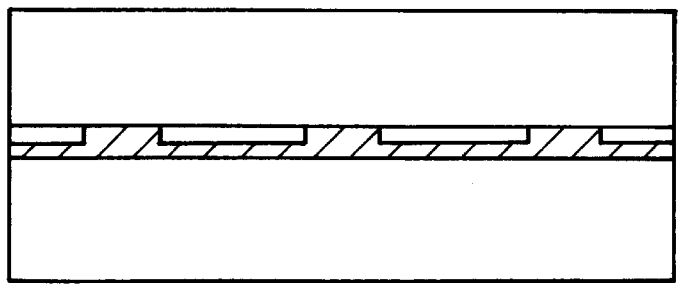
Figure 32D:
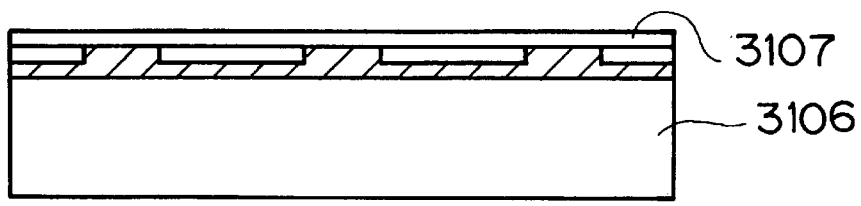

In FIG. 32(c), the substrates C and D are bonded each other in a high-temperature vacuum or high-temperature oxygen atmosphere of 900 to 1,200 C so that the aluminum nitride layer 3105 is present between the substrates. Finally, in FIG. 32(d), the semiconductor device of the present invention having the structure shown in FIG. 30 is obtained by thinning the single-crystal silicon substrate 3101 (substrate C) having the silicon oxide 3102 and aluminum nitride layer 3105 to a desired thickness through grinding and/or etching.

Figure 33:
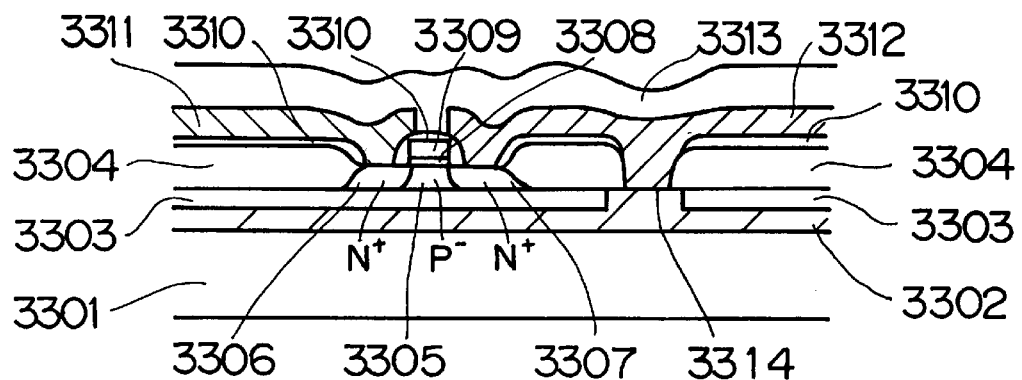
FIG. 33 is a sectional view of the semiconductor device of the present invention.

FIG. 33 is a sectional view of the semiconductor device of still another embodiment of the present invention, which shows a partial sectional view of the semiconductor device in which an integrated circuit is formed on an SOI wafer having a single-crystal silicon layer on an insulator.

Symbol 3301 is a single-crystal silicon substrate with a thickness of over hundred to 1000 $\mu$m, 3302 is an aluminum nitride layer with a thickness of one thousand angstroms for device isolation formed by oxidizing a thin single-crystal silicon layer on the silicon oxide 3303. In FIG. 33, the bottom of the silicon oxide 3304 contacts the silicon oxide 3303. Symbol 3305 is a P-well region containing P-type impurities at a concentration of approx. $1\times10^{16}$ cm$^{-3}$ in the thin single-crystal silicon layer, 3306 and 3307 are a source region and drain region containing N-type impurities at a concentration of approx. $1\times10^{20}$ cm$^{-3}$ in the thin single-crystal silicon layer respectively. Symbol 3308 is a gate insulator made of a silicon oxide film with a thickness of one hundred angstroms formed by oxidizing a thin single-crystal silicon layer and 3309 is a gate made of a polycrystal silicon containing N-type impurities at a high concentration. An N-type MOS transistor comprises the gate 3309, gate insulator 3308, source 3306, drain 3307, and P-well 3305.

Symbol 3310 is an intermediate insulating film formed by depositing a silicon oxide with a thickness of over thousand Angstroms. Symbol 3311 is an aluminum layer electrically connecting with the source 3306 and 3312 is an aluminum layer electrically connecting with the drain 3307. The aluminum layers 3311 and 3312 also serve as wiring as they extend to the left and right of FIG. 33. Symbol 3313 is a passivation film made of a silicon nitride.

In FIG. 33, the aluminum nitride layer 3302 and silicon oxide film 3303 serve as insulators of a single-crystal silicon wafer on insulator (SOI wafer) and an SOI layer comprises the P-well 3305, source 3306, and drain 3307.

The aluminum wiring 3312 contacting the drain 3307 contacts the aluminum nitride layer 3302 at the position of 3314. When the N-type MOS transistor operates, the heat produced in a thin single-crystal silicon layer, that is, the P-well 3305, source 3306, and drain 3307 in FIG. 11 is transmitted to the aluminum wiring 3312 and released to the aluminum nitride layer 3302 and the single-crystal silicon substrate 3301 serving as a heat sink through the portion 3314 where the aluminum nitride layer 3302 contacts the aluminum wiring 3312. Therefore, for the semiconductor device having the structure of the present invention shown in FIG. 33, the heat produced in the thin single-crystal silicon layer is not stored in the thin single-crystal silicon layer but it prevents the temperature of the thin single-crystal silicon layer from rising.

The aluminum nitride layer is described above by taking a material expressed by the chemical formula of AiN as an example. However, a material expressed by the chemical formula of $Al_xN_y$ has the almost same heat conductivity as the material AlN. The material expressed by the formula of $Al_xN_y$ also has the advantageous features of the present invention described herein. Therefore, matters described concerning the aluminum nitride in the present invention are applied not only to AlN but to $Al_xN_y$. Moreover, a high heat radiation effect is also obtained by using a film made of carbon or sapphire ($Al_2O_3$) instead of AlN.

For the semiconductor device made of single-crystal silicon on the insulating film of the present invention, the substrates 2404 and 2804 shown in FIGS. 24, 26, and 28 are included in the embodiments of the present invention even if they are transparent substrates made of quartz or glass. In this case, the silicon oxide, aluminum nitride layer, and quartz can be used for an active-matrix light valve device because they are transparent.

Figure 34:
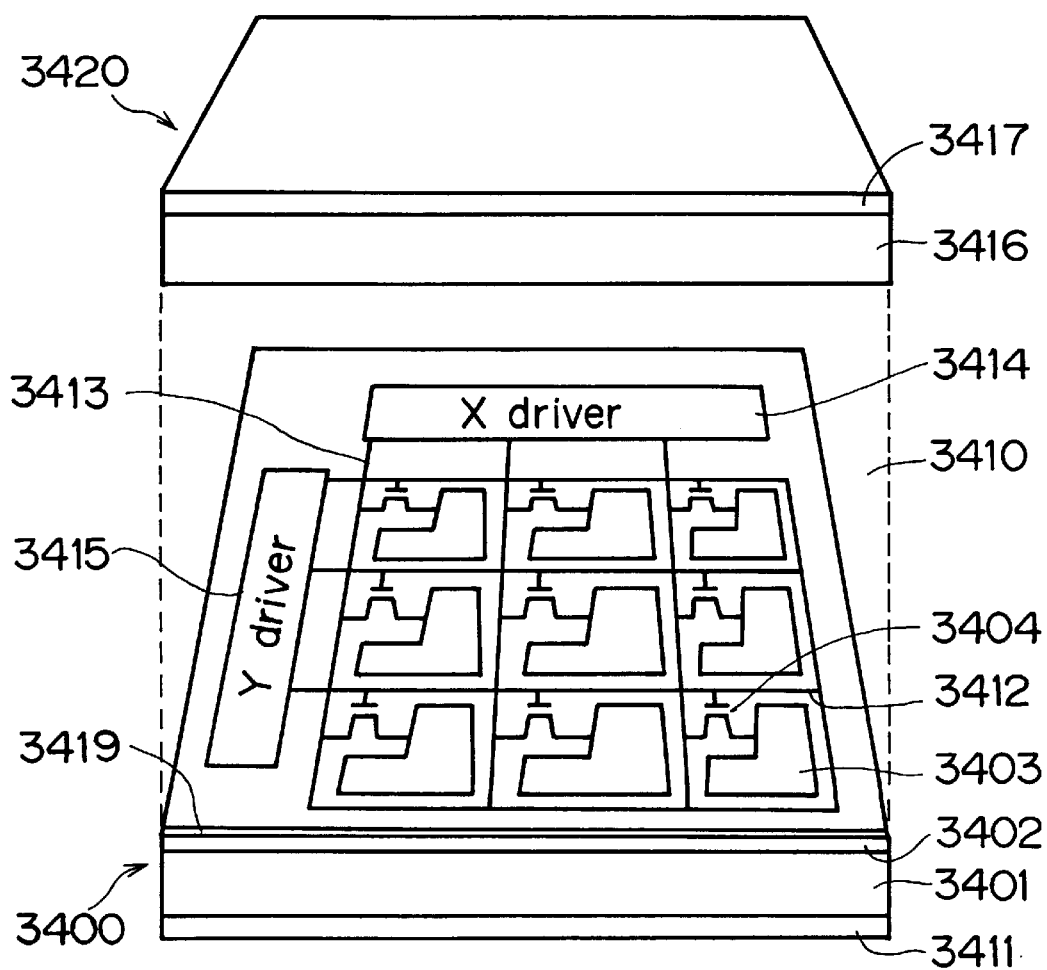
FIG. 34 is a light valve device using the semiconductor substrate of the present invention.

FIG. 34 shows an embodiment of a light valve device constituted by using the semiconductor substrate of the present invention, in which liquid crystal is used as an electrooptical material. In FIG. 34, the embodiment comprises a semiconductor substrate 3400, a facing substrate 3420 and a liquid crystal layer 3410 filled in the substrate. The semiconductor substrate comprises a support substrate 3401 made of a transparent material, an aluminum nitride layer 3402 formed on the support substrate, and a silicon oxide 3419. An X driver 3414 and Y driver 3415 constituting a peripheral circuit section, a plurality of scanning lines 3412 connecting with the Y driver, a plurality of signal lines 3413 connecting with the X driver, an Sw-Tr 3404 formed on each intersection between each signal line and each scanning line, and a pixel electrode 3403 are formed on the semiconductor substrate 3400.

In FIG. 34, top and bottom polarizing plates 3417 and 3411 are formed. However, it is not always necessary to bond the polarizing plates to transparent substrates 3416 and 3401 but it is possible to arrange them separately. The X and Y drivers constituting the peripheral circuit section comprises the semiconductor device shown in FIG. 33. In FIG. 34, a structure is shown in which the aluminum nitride layer 3402 is formed on the transparent substrate 3401, for easy understanding. However, it is also possible to form only a necessary portion of the aluminum nitride layer, for example, only the bottom of the peripheral circuit section.

Figure 35:
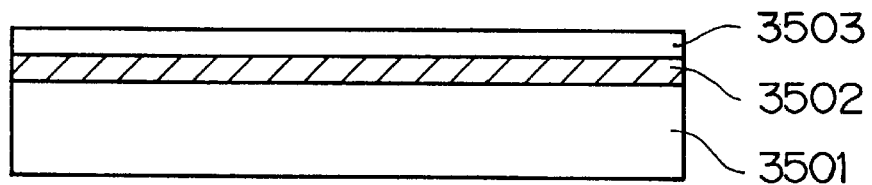
FIG. 35 is a sectional view of the semiconductor device of the present invention.

FIG. 35 shows a sectional view of the semiconductor device of the present invention. Symbol 3501 is a transparent insulating substrate made of quartz or glass, 3502 is an insulating film with a high heat conductivity made of aluminum nitride or the like, and 3503 is a semiconductor film made of single-crystal silicon, polycrystal silicon, or a-Si. When a transistor or integrated circuit formed in the semiconductor film 3503 operates, the heat produced in the semiconductor film 3503 is transmitted to the insulating film 3502 made of aluminum nitride or the like with a high heat conductivity without remaining in the semiconductor film 3503.

For the embodiment in FIG. 35, the insulating substrate 3501 is transparent and the film 3502 is transparent when aluminum nitride forms the thin film. Therefore, the embodiment can be applied to a light-transmission-type active-matrix display device.

Figure 36:
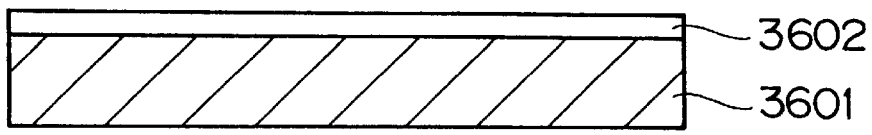
FIG. 36 is a sectional view of the semiconductor device of the present invention.

FIG. 36 shows a sectional view of still another embodiment of the semiconductor device of the present invention. Symbol 3601 is an insulating substrate with a high heat conductivity made of aluminum nitride or the like. Symbol 3602 is a semiconductor film made of single- crystal silicon, polycrystal silicon, or a-Si.

In the semiconductor device having the structure shown in FIG. 36, when a transistor or integrated circuit formed in the semiconductor film 3602 operates, the heat produced in the semiconductor film 3602 is transmitted to the insulating film 3601 having a high heat conductivity, since it is made of aluminum nitride or the like, and is released to the outside of the semiconductor device without remaining in the semiconductor film 3602.

Figure 37:
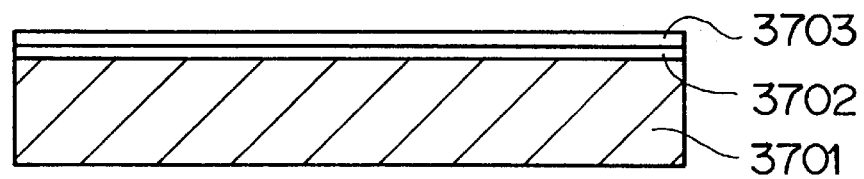
FIG. 37 is a sectional view of the semiconductor device of the present invention.

FIG. 37 is a sectional view of still another embodiment of the semiconductor device of the present invention. Symbol 3701 is an insulating substrate with a high heat conductivity made of aluminum nitride or the like. Symbol 3702 is a thin insulating film made of a silicon oxide film or the like. Symbol 3703 is a semiconductor film made of single-crystal silicon, polycrystal silicon, or a-Si.

In the semiconductor device having the structure shown in FIG. 37, when a transistor or integrated circuit formed in the semiconductor film 3703 operates, the heat produced in the semiconductor film 3703 passes through the thin insulating film 3702 and it is easily released to the insulating film 3701 having a high heat conductivity, since the insulating film 3702 is made of aluminum nitride or the like; without remaining in the semiconductor film 3703.

One of the reasons the insulating film 3702 is used in the structure in FIG. 37 is that, if the insulating substrate 3701 with a high heat conductivity is made of aluminum nitride, the aluminum nitride has a piezoelectric characteristic. A transistor and integrated circuit are formed in the semiconductor film 3703 and the current and voltage produced due to the operation of these devices influence the aluminum nitride having the piezoelectric characteristic, and thereby the semiconductor film 3703 and aluminum nitride 3701 may interact. The thin insulating film 3702 prevents the interaction.

Another reason the insulating film 3702 is used in the structure of FIG. 37 that it is easier to form a semiconductor film on a silicon oxide film than to directly form the semiconductor film on aluminum nitride with a high heat conductivity. In the above description, aluminum nitride is listed as an insulator with a high heat conductivity. The heat conductivity of the aluminum nitride is 2.5 W/cm ° K. at the ordinary temperature as previously described, which is much higher than 0.014 W/cm ° K., which is the heat conductivity of a silicon oxide film serving as an insulating film, and is also higher than 1.5 W/cm ° K., which is the heat conductivity of single-crystal silicon serving as a semiconductor. Therefore, it is understood that aluminum nitride has an excellent heat conductivity.

Figure 38:
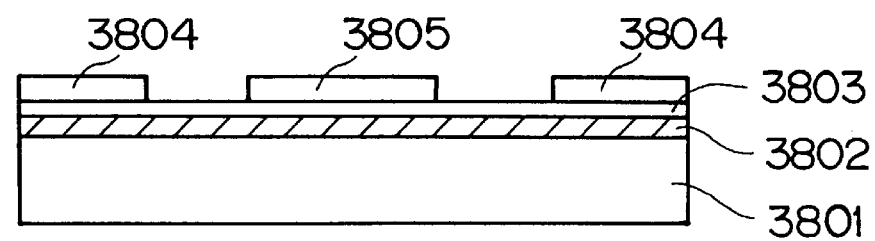
FIG. 38 is a sectional view of the semiconductor device of the present invention.

FIG. 38 is a sectional view of still another embodiment of the semiconductor device of the present invention. Symbol 3801 is a transparent insulating substrate, 3802 is an insulating film with a high heat conductivity made of aluminum nitride or the like, 3803 is a silicon oxide film, 3804 at the top both ends of the silicon oxide film 3803 is a single-crystal silicon layer, and 3805 at the top central portion of the silicon oxide film 3803 is Poly-Si. In the embodiment of the present invention shown in FIG. 38, the transparent insulating substrate 3801, aluminum nitride 3802, and silicon oxide film 3803 are all transparent. Therefore, it is possible to use the embodiment as an active-matrix display device by forming, for example, a picture element Sw-Tr group on the polycrystal silicon layer 3805 and a driver circuit for operating the pixel Sw-Tr group on the single-crystal silicon layer 3804.

Also for the above structure, even if the picture element switching transistor group formed on the polycrystal silicon layer 3805 and the driver circuit formed in the single-crystal silicon layer 3804 simultaneously operate, the heat produced thereby passes through the silicon oxide film 3803 and is transmitted to the aluminum nitride layer 3802 serving as a heat sink without remaining in the Poly-Si layer 3805 serving as a semiconductor layer and single- crystal silicon layer 3804. In this case, it is preferable that the thickness of the silicon oxide film 3803 is not very large, for example; one thousand angstroms.

FIGS. 39(*a*) to 39(*h*) are sectional views of the steps showing the fabrication method of the semiconductor device of the present invention shown in FIG. 38. This method uses the SOI wafer forming method according to the bonding method.

In FIG. 39(*a*), symbol 3901 is a single-crystal silicon substrate and 3902 is a silicon oxide film obtained by oxidizing the single-crystal silicon substrate 3901. The silicon oxide film 3902 has a thickness of one hundred angstroms to several μm. The single-crystal silicon substrate 3901 on which the silicon oxide film 3902 is formed is referred to as substrate A.

Symbol 3904 is a transparent insulating substrate and 3903 is an aluminum nitride layer formed on the surface of the transparent insulating substrate 3904. The transparent insulating substrate 3904 on which the aluminum nitride layer 3903 is referred to as substrate B.

In FIG. 39(*b*), the substrate A and the substrate B are bonded each other in a high-temperature vacuum or high-temperature oxygen atmosphere of 900 to 1,200° C. so that the silicon oxide film 3902 faces the aluminum nitride layer 3903.

Figure 39A:
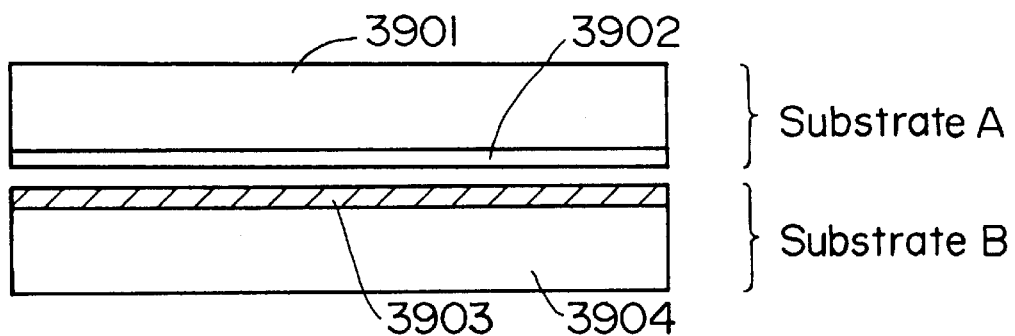
FIGS. 39(a) to 39(h) are sectional views of the steps of fabricating the semiconductor device of the present invention.
Figure 39B:
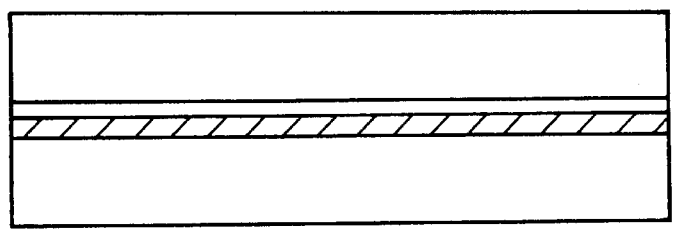
Figure 39C:
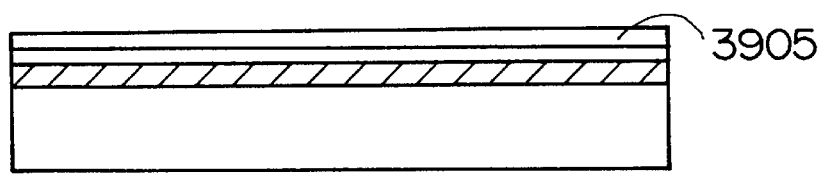
Figure 39D:
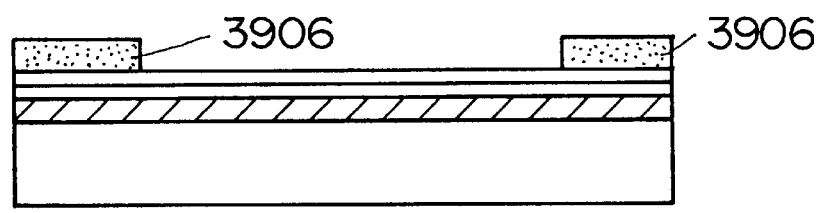

Moreover, in FIG. 39(c), the single-crystal silicon substrate 3901 on which the silicon oxide film 3902 is formed is removed up to a desired thickness through grinding and/or etching. As a result, a thin single-crystal silicon layer 3905 serving as an SOI layer is formed on the aluminum nitride layer 3903 and silicon oxide film 3902. In FIG. 39(d), resist 3906 is left at the both ends of the thin single-crystal silicon layer 3905 by applying resist onto the single-crystal silicon layer 3905 and removing the central resist through photolithography.

Figure 39E:
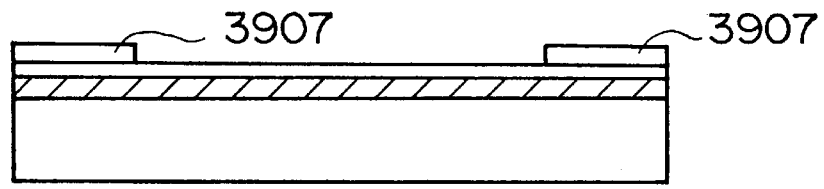

Then, in FIG. 39(e), the thin single-crystal silicon 3905 is removed through dry etching and thereafter the resist 3906 is removed. As a result, a single-crystal silicon layer 3907 is left at the top right and left of the silicon oxide film 3902.

Figure 39F:
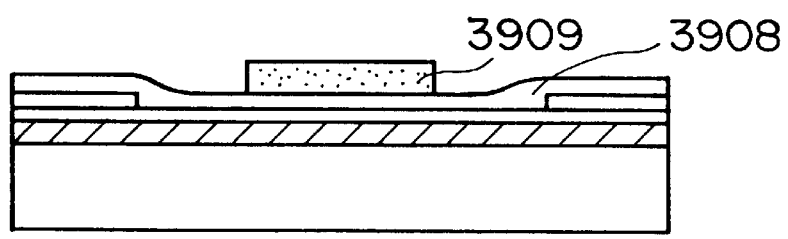
Figure 39G:
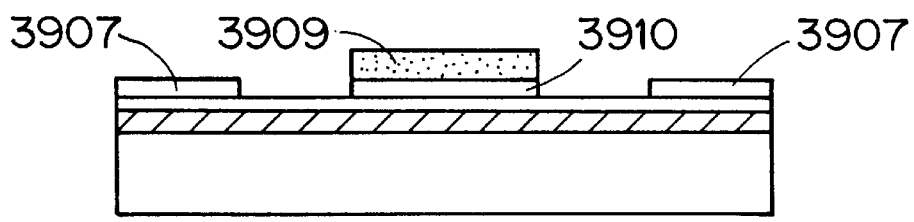

In FIG. 39(f), resist 3909 is left at the central portion of Poly-Si 3908 through photolithography by depositing the Poly-Si 3908 and then applying resist to it. Then, in FIG. 40(g), the Poly-Si 3908 is dry-etched to leave an islanded Poly-Si 3910 under the central resist 3909.

Figure 39H:
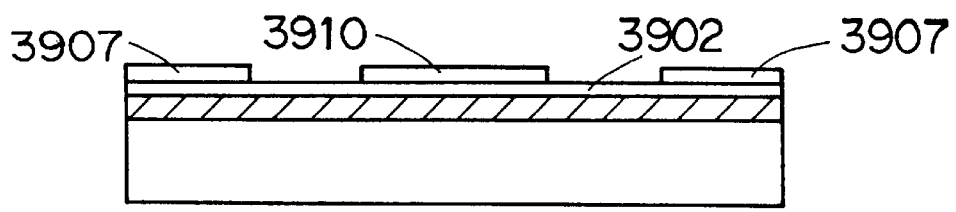

In FIG. 39(h), when the resist 3909 is removed, an islanded single-crystal silicon 3907 is formed at the top both ends of the silicon oxide film 3902, the islanded polycrystal silicon 3910 is formed at the central portion, and the structure of the semiconductor device of the present invention shown in FIG. 38 is finished.

Figure 40:
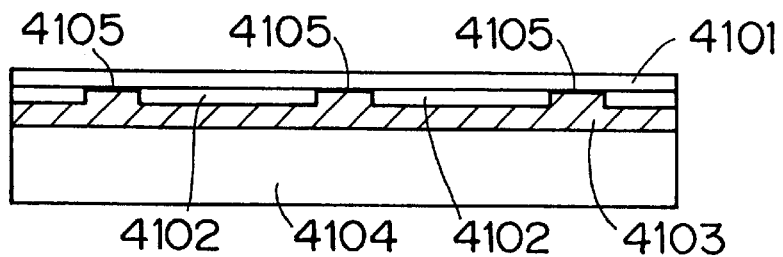
FIG. 40 is a sectional view of the semiconductor device of the present invention.

FIG. 40 shows a sectional view of still another embodiment of the present invention. Symbol 4101 is a semiconductor film, 4102 is a silicon oxide film, 4103 is an aluminum nitride layer, and 4104 is a thick transparent insulating substrate.

In FIG. 40, the silicon oxide film 4102 is removed at a portion 4105 where the aluminum nitride layer contacts the semiconductor film 4101. For this structure, the heat produced in the thin semiconductor film due to the operation of an integrated circuit formed on the semiconductor film 4101 is transmitted to the aluminum nitride layer 4103 with a high heat conductivity trough the portion 4105 where the aluminum nitride layer 4103 directly contacts the thin semiconductor film 4101. Therefore, for the semiconductor device of the present invention in FIG. 40, the temperature of the thin semiconductor film 4101 can be prevented from rising even while the integrated circuit operates.

Figure 41:
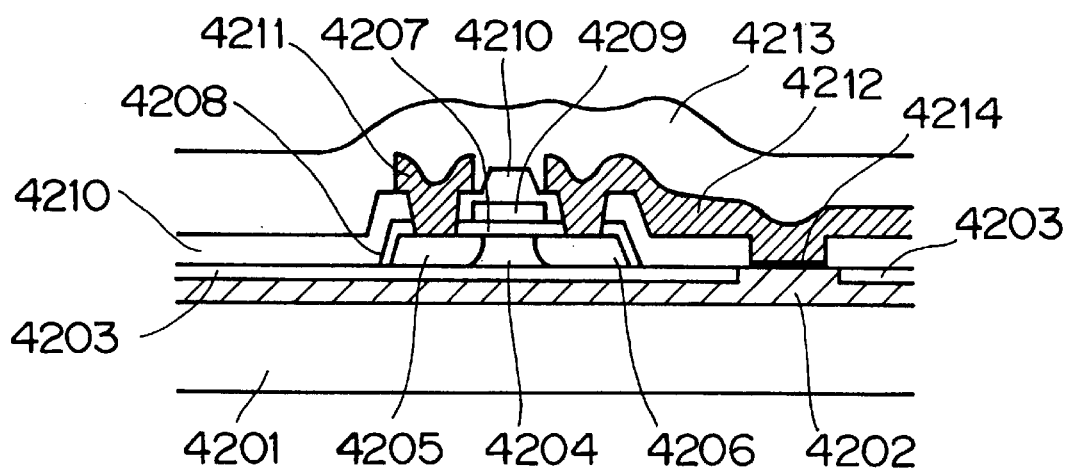
FIG. 41 is a sectional view of the semiconductor device of the present invention.

FIG. 41 is a sectional view of the semiconductor device of still another embodiment of the present invention, which shows a sectional view of a semiconductor film on an insulator, that is, a sectional view of a portion of a semiconductor device in which an integrated circuit is formed on a Poly-Si film.

Symbol 4201 is an insulating substrate made of glass or quartz, 4202 is an aluminum nitride layer with a thickness of one thousand angstroms to several $\mu$m, and 4203 is a silicon oxide film with a thickness of one thousand angstroms to several $\mu$m. Symbol 4204 is a P-well region containing P-type impurities at a concentration of approx. $1\times10^{16}$ cm$^{-3}$ in a thin Poly-Si, 4205 and 4206 are a source region and drain region containing N-type impurities at a concentration of approx. $1\times10^{20}$ cm$^{-3}$ in a thin Poly-Si layer respectively.

Symbol 4207 is a gate insulating film made of a silicon oxide film formed by oxidizing a thin Poly-Si film, 4208 is a silicon oxide film formed on the side wall of a Poly-Si film when the gate oxide film 4207 is formed, and 4209 is a gate made of Poly-Si containing N-type impurities at a high concentration. An N-type MOS transistor comprises the gate 4209, gate insulating film 4207, source 4205, drain 4206, and P-well 4204. Symbol 4210 is an intermediate insulating film formed by depositing a silicon oxide film with a thickness of over thousand angstroms. Symbol 4211 is an aluminum layer electrically connecting with the source 4205 and 4212 is an aluminum layer electrically connecting with the drain 4206. The aluminum layer 4211 also serves as wiring as it extends in the longitudinal direction of FIG. 41 and the aluminum layer 4212 serves as wiring as it extends toward the right of FIG. 41. Symbol 4213 is a passivation film made of a silicon nitride film.

In FIG. 41, the aluminum wiring 4212 contacts the aluminum nitride layer 4202 at a portion 4214. When an N-type MOS transistor operates, the heat produced in a thin Poly-Si film, that is, in the P-well 4204, source 4205, and drain 4206 in FIG. 41 is transmitted to the aluminum wiring 4212 and released to the aluminum nitride layer 4202 through the portion 4214 where the aluminum nitride layer 4202 contacts the aluminum wiring 4212. Therefore, for the semiconductor device having the structure of the present invention in FIG. 41, the heat produced in a thin polycrystal silicon film prevents the temperature of the thin polycrystal silicon layer from rising without remaining in the thin polycrystal silicon layer.

In FIG. 41, the aluminum wiring 4212 contacts the aluminum nitride layer 4202 at a portion 4214. But it is also possible for the aluminum wiring connecting another terminal, such as the source or well, to contact the aluminum nitride layer 4202.

Embodiments of the present invention for solving problem (4) are described below.

That is, a structure is considered which releases the heat produced due to the operation of an integrated circuit formed on a single-crystal silicon substrate by a very small size Tr.

Figure 42:
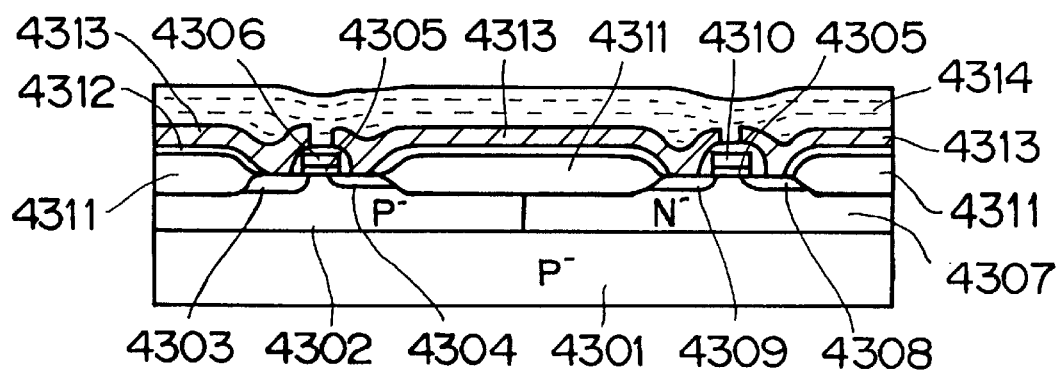
FIG. 42 is a sectional view of the semiconductor device of the present invention.
Figure 44:
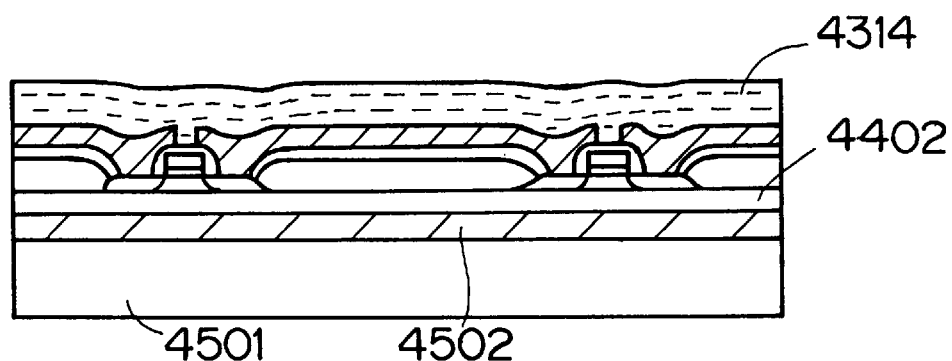
FIG. 44 is a sectional view of the semiconductor device of the present invention.
Figure 45:
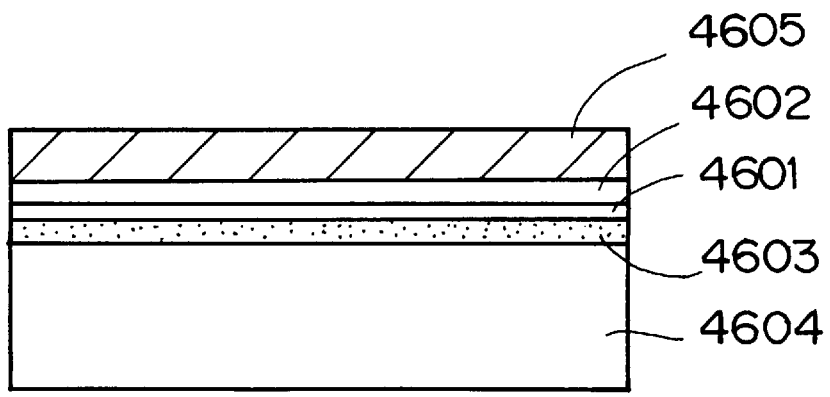
FIG. 45 is a typical sectional view of an embodiment of the semiconductor substrate of the present invention.

FIGS. 42, 44, and 45 show still another embodiments of the present invention. In these three drawings, like elements are identified with the same reference numeral in order to simplify the description.

In FIG. 42, symbol 4301 is a single-crystal silicon substrate containing P-type impurities at a low concentration, 4302 is a P-well containing P-type impurities at a concentration slightly higher than that of the single-crystal silicon substrate, 4303 and 4304 are a source and drain containing N-type impurities at a high concentration respectively, 4305 is a gate insulating film, 4306 is a gate made of Poly-Si containing impurities at a high concentration, 4307 is an N-well containing N-type impurities at a low concentration, 4308 and 4309 are a source and drain containing P-type impurities at a high concentration respectively, and 4310 is a gate made of Poly-Si containing impurities at a high concentration.

Symbol 4311 is a thick silicon oxide film for device isolation, 4312 is an intermediate film made of a silicon oxide film formed by depositing the silicon oxide film, and 4313 is a metal electrode formed of a material such as aluminum. Symbol 4314 is a passivation film with a high heat conductivity. The passivation film 4314 has an insulating characteristic and uses, for example, aluminum.

In FIG. 42, an N-type MOS Tr comprises the P-well 4302, source 4303, drain 4304, gate insulating film 4305, and gate 4306. A P-type MOS Tr comprises the N-well 4307, source 4308, drain 4309, gate insulating film 4305, and gate 4310.

The heat produced due to the operations of the N-type MOS Tr and P-type MOS Tr is released not only to the single-crystal silicon layer 4301 of the substrate but to the passivation film 4314 with a high heat conductivity at the top of the Tr's. Therefore, the Tr temperature does not rise even if the Tr's are very small in size and a large current flows through the Tr's.

Figure 43:
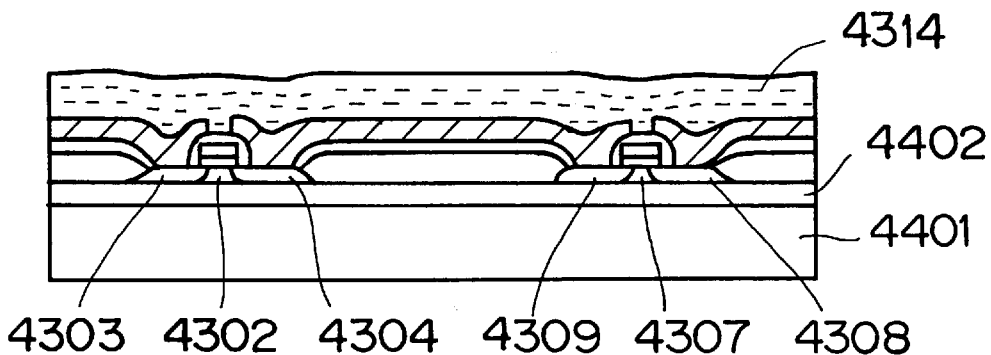
FIG. 43 is a sectional view of the semiconductor device of the present invention.

The embodiment of the present invention in FIG. 43 is different from that of the present invention in FIG. 42 only in the fact that the embodiment in FIG. 43 uses an SOI wafer. That is, in FIG. 43, symbol 4401 is a single-crystal silicon substrate and 4402 is a silicon oxide film of single-crystal silicon. A thin single-crystal silicon layer is present on the silicon oxide 4402 where an N-type MOS Tr and P-type MOS Tr are formed. That is, the SOI layer comprises the P-well 4302, source 4303, and drain 4304 of the N-type MOS Tr and the N-well 4307, source 4308, and drain 4309 of the P-type MOS Tr.

For the SOI wafer, the heat produced to the operation of the Tr's is hardly transmitted to the single-crystal silicon substrate 4401 under the silicon oxide 4402. In FIG. 43, however, because the passivation film 4314 on the Tr's is made of a material with a high heat conductivity, the heat produced due to the Tr's is transmitted to the passivation film 4314 through the metal electrodes 4313 and therefore, the SOI layer temperature hardly rises.

FIG. 44 shows an embodiment of the present invention using SOI similarly to the embodiment in FIG. 43. Symbol 4501 is a transparent insulating substrate and 4502 is a layer with a high heat conductivity. The structure above the silicon oxide film 4402 is the same as that in FIG. 43. The heat produced in the N-type and P-type MOS Tr regions is transmitted to the passivation film 4314 with a high heat conductivity on the Tr's and a heat conductive layer 4502 under the silicon oxide film 4402. Therefore, the Tr region temperature does not rise.

For the embodiment in FIG. 44, the transparent insulating substrate 4501 has a low heat conductivity and the heat conductive layer 4502 between the silicon oxide film layer 4402 and transparent insulating substrate 4501 is effective to release the heat produced in the Tr's downward.

For the embodiment: in FIG. 44, it is possible to use an insulator for the heat conductive passivation film 4314 and a metal for the heat conductive layer 4502. Because the passivation film 4314 contacts the metal electrodes 4313, it must be made of an insulator. When using a metal for the heat conductive layer 4502, very high heat conductivity can be obtained.

The following is the description of an embodiment of the present invention for the problem (5).

FIG. 45 is a typical sectional view of an embodiment of the semiconductor substrate of the present invention, in which a single-crystal silicon thin-film device forming layer 4601 is formed above an insulating support substrate 4604 through an adhesive layer 4603, an insulating layer 4602 is formed on the single-crystal silicon thin-film device forming layer 4601, and a heat conductive layer 4605 made of a material superior in the heat conductivity is formed on the insulating layer 4602.

In this case, it is possible to use a transparent material of glass or quartz for the insulating support substrate 4604. The layer 4605 superior in the heat conductivity is made of a metal or resin. Moreover, it is possible to form the layer 4605 made of a material superior in the heat conductivity with a transparent material.

Figure 46:
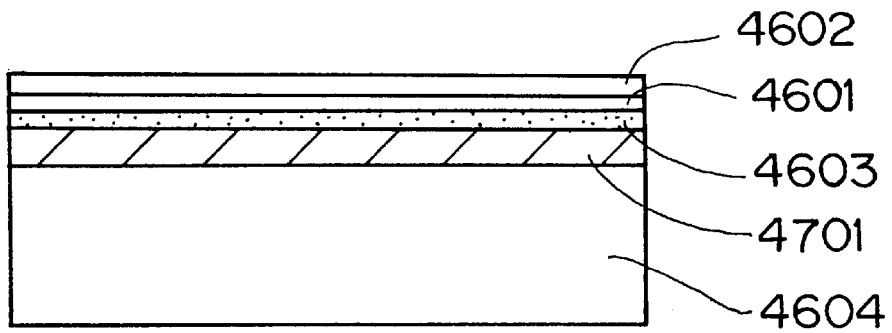
FIG. 46 is a typical sectional view of another embodiment of the semiconductor substrate of the present invention.

FIG. 46 is a typical sectional view of another embodiment of the semiconductor substrate of the present invention. The embodiment in FIG. 46 is different from that in FIG. 45 in the fact that the heat conductive layer 4701 is formed between the insulating support substrate 4604 and adhesive layer 4603.

Figure 47:
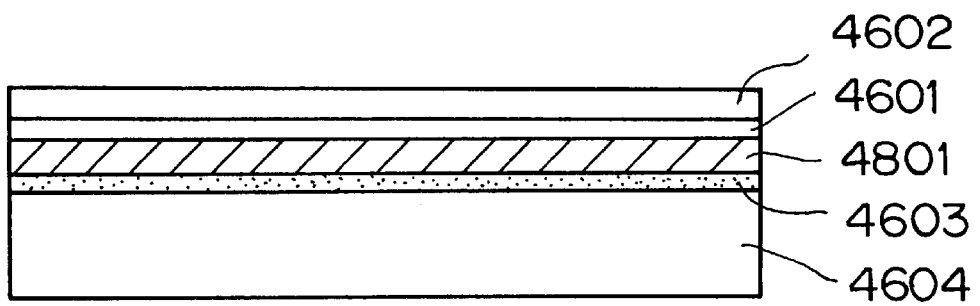
FIG. 47 is a sectional view of the semiconductor device of the present invention.

FIG. 47 is a typical sectional view of still another embodiment of the semiconductor substrate of the present invention.

The embodiment in FIG. 47 is different from that in FIG. 45 in the fact that the position of the heat conductive layer 4801 and that of the adhesive layer 4603 are reversed. By reversing the positions of them, heat is easily released to the heat conductive layer 4801 because the distance between the single-crystal silicon thin-film device forming layer 4601 and heat conductive layer 4801 becomes smaller than that in the embodiment of FIG. 45.

Figure 48:
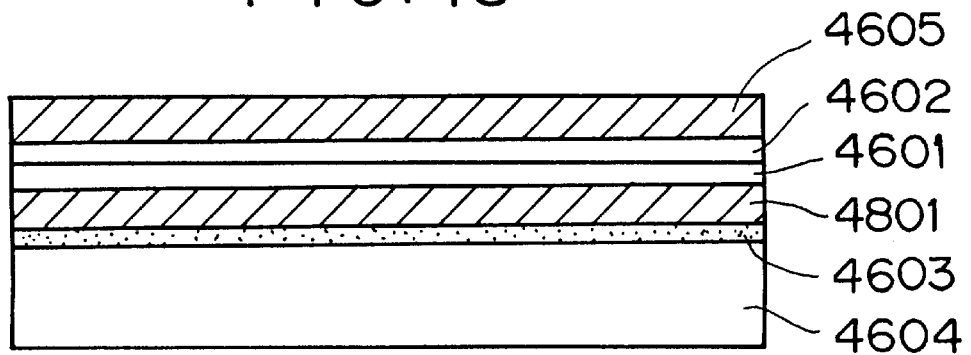
FIG. 48 is a sectional view of the semiconductor device of the present invention.

FIG. 48 is a typical sectional view of still another embodiment of the semiconductor substrate of the present invention. The embodiment features that the heat conductive layer 4605 is formed on the insulating layer 4602, the heat conductive layer 4801 is formed between the adhesive layer 4603 and single-crystal silicon thin-film device forming layer 4601, that is, a heat conductive layer is formed at two places. By forming the heat conductive layer at two places, the heat produced in the single-crystal silicon thin-film device forming layer 4601 is released to the top heat conductive layer 4605 and the bottom heat conductive layer 4801. Therefore, the heat hardly remains in the single-crystal silicon thin-film device forming layer 4601 compared with the case of the embodiment in FIG. 46.

The embodiments of the present invention in FIGS. 45 to 48 feature that the heat conductive layers 4605, 4701 and 4801 are made of an insulator such as aluminum nitride. Because aluminum nitride is transparent, it is suitable for a light-valve semiconductor substrate. Moreover, it is possible to use a metal such as aluminum with a very high heat conductivity for the insulator 4602 and heat conductive layer 4605.

For the embodiment in FIG. 48, it is more preferable that the heat conductive layer 4605 is made of a metal such as aluminum and the heat conductive layer 4801 is made of an insulator such as aluminum nitride. That is, it is better that the heat conductive layer 4801 is made of an insulator to prevent shorting because the heat conductive layer 4801 may contact a metallic wiring layer formed on the single-crystal silicon thin-film device forming layer 4601.

For the embodiments of the present invention in FIGS. 46 to 48, it is also possible to use a transparent material such as glass or quartz for the insulating support substrate 4604 similarly to the embodiment in FIG. 45.

For the embodiments of the present invention in FIGS. 45 to 48, the heat conductive layer 4605 is formed by adhering closely to the insulating layer 4602 contacting the single-crystal silicon thin-film device forming layer 4601 or the heat conductive layer 4701 or 4801 is formed by adhering closely to the adhesive layer 4603 contacting the single-crystal silicon thin-film device forming layer 4601.

Therefore, when forming a MOS integrated circuit on the single-crystal silicon thin-film device forming layer 4601, the heat produced by the MOS integrated circuit can be quickly released and then it can be protected from a large number of carriers becoming deeply trapped into the gate insulating film of a MOS Tr by the heat and a voltage applied to the drain region of the MOS Tr. As a result, it is possible to prevent a deterioration which causes the Vt of the MOS Tr to rise.

Figure 49:
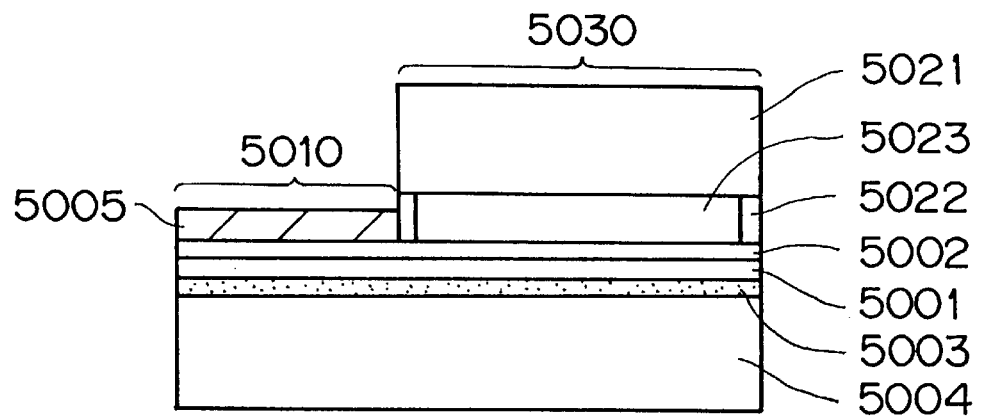
FIG. 49 is a typical sectional view of the light valve device of an embodiment using the light-valve semiconductor substrate of the present invention.

FIG. 49 is a typical sectional view of the light valve device of an embodiment using the light-valve semiconductor substrate of the present invention.

In FIG. 49, a single-crystal silicon thin-film device forming layer 5001 is formed above an insulating support substrate 5004 through an adhesive layer 5003, an insulating layer 5002 is formed on the single-crystal silicon thin-film device forming layer 5001, a driving circuit forming region 5010 with a driving circuit formed and a pixel region 5030 with an Sw-Tr formed for each pixel are formed on the single-crystal silicon thin-film device forming layer 5001, and a heat conductive layer 5005 made of a material superior in the heat conductivity is formed on the insulating layer 5002 on the driving circuit forming region 5010. Moreover, a liquid crystal alignment layer though not illustrated is formed on the insulating layer 5002 on a pixel region 5030, a facing substrate 5021 with a facing electrode and liquid crystal alignment layer (not illustrated for simplification) formed on the surface is bonded by a seal 5022, and a liquid crystal layer 5023 is formed between an orientation film on the insulating layer 5002 and an orientation film on the facing substrate 5021.

For the light valve device in FIG. 49, the heat conductive layer 5005 is formed only on the insulating layer 5002 on the driving circuit forming region 5010. This is because the driving circuit always operates, a Sw-Tr formed for each pixel in the pixel region 5030 does not always operate, and each Sw-Tr is turned on only for approx. 30 msec for screen display with a television signal.

For the light valve device in FIG. 49, the insulating support substrate 5004, adhesive layer 5003, and facing substrate 5021 are made of a transparent material to form a transmission-type light valve arrangement. However, the heat conductive layer 5005 is not necessarily made of a transparent material but it is made of a metal or resin.

Figure 50:
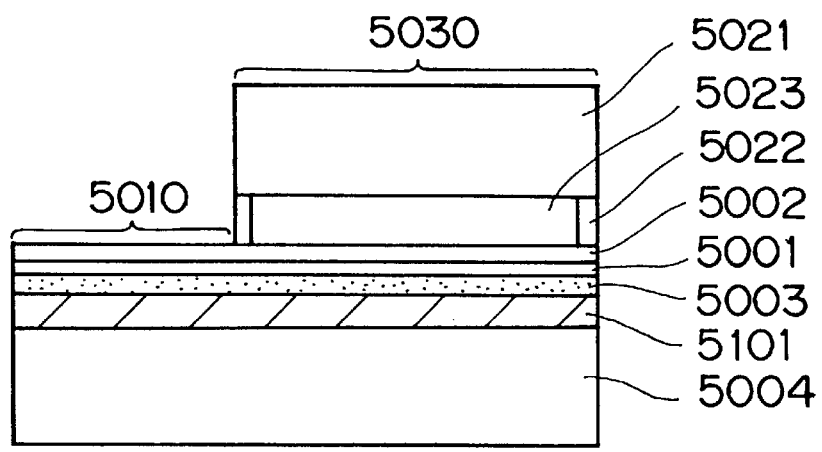
FIG. 50 is a typical sectional view of the light valve device of another embodiment using the light-valve semiconductor substrate of the present invention.

FIG. 50 is a typical sectional view of the light valve device of another embodiment using the light-valve semiconductor substrate of the present invention.

The embodiment in FIG. 50 is different from that in FIG. 49 in the fact that a heat conductive layer 5101 is formed between the insulating support substrate 5004 and adhesive layer 5003. In this case, because the heat conductive layer 5101 is formed also at the bottom of the picture element region 5030, it is necessary that the heat conductive layer 5101 is formed with a transparent material in order to form a transmission-type light valve device. Though not illustrated, it is possible to further form a layer made of a material superior in the heat conductivity on the insulating layer 5002 on the driving circuit forming region 5010. Other components are provided with symbols same as those in FIG. 49 and their descriptions are omitted.

Figure 51:
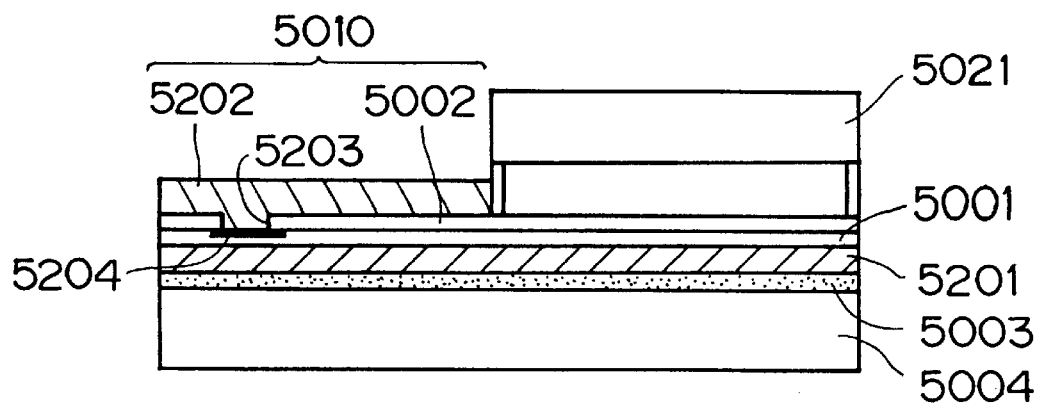
FIG. 51 is a typical sectional view of the light valve device of still another embodiment using the light-valve semiconductor substrate of the present invention.

FIG. 51 is a typical sectional view of the light valve device of still another embodiment using the light-valve semiconductor substrate of the present invention.

Symbol 5201 is aluminum nitride superior in the heat conductivity present between the adhesive layer 5003 and single-crystal silicon thin-film device forming layer 5001. Symbol 5202 is aluminum superior in the heat conductivity present on the insulating layer 5002 on the driving circuit forming region 5010. The aluminum 5202 releases the heat produced in the driving circuit forming region 5010 where heat is especially produced in the single-crystal silicon thin-film device forming layer 5001 by drilling a hole at a portion 5203 of the insulating layer 5002. Moreover, because the aluminum 5202 contacts a ground terminal formed in the single-crystal silicon thin-film device forming layer 5001, it efficiently releases heat also from the terminal. This is because the heat led to the ground terminal by metallic wiring is easily released to the aluminum 5202. Moreover, when the aluminum on the insulating layer 5002 is electrically set to the ground and it is stabilized, it is possible to prevent electrical influences of the single- crystal silicon thin-film device forming layer 5001 and therefore, stable operation of a driving circuit is realized.

For the embodiments in FIGS. 49 to 51, as described by the embodiments in FIGS. 45 to 48, the heat conductive layer 5005 is formed by adhering closely to the insulating layer 5002 contacting the single-crystal silicon thin-film device forming layer 5001 or the heat conductive layers 5101 and 5201 are formed by adhering closely to the adhesive layer 5003 contacting the single-crystal silicon thin-film device forming layer 5001. Therefore, when forming a driving circuit comprising a MOS integrated circuit on the single-crystal silicon thin-film device forming layer 5001, the heat produced by the driving circuit canoe quickly released and then it can be protected from a lot of carriers becoming deeply trapped into the gate insulator of a MOS Tr. As a result, it is possible to prevent a deterioration which causes the Vt of the MOS Tr to rise and form a light valve device for forming the driving circuit and the Sw-Tr for each pixel by using single-crystal silicon for the device.

As described in detail, the semiconductor device of the present invention has the following excellent characteristics.

(1) The semiconductor device for a light valve substrate of the present invention in which a driving circuit section comprising at least a complementary MOS integrated circuit and a picture element Sw-Tr group are formed on a thin single-crystal silicon layer on an electrical insulator has the excellent characteristics that picture element Sw-Tr's to which a high voltage is applied have a small Vt fluctuation according to elapse of time and moreover, leak current due to light is very small.

(2) The semiconductor device of the present invention has a high operation frequency. It is possible to easily release the heat produced in a circuit with a large power consumption by forming the circuit on single-crystal silicon in a region having no electrical insulating film and moreover, obtain a high-speed semiconductor device with a high reliability and stable performance by forming a circuit with a small power consumption and requiring a high speed on thin single-crystal silicon on an electrical insulating film.

Moreover, by removing a single-crystal silicon layer left under an insulating film formed in single-crystal silicon and forming a single-crystal silicon layer on the insulating film into an island, an optically opaque region can be obtained at the top and bottom of a single-crystal silicon substrate in a region where no single-crystal silicon island like a silicon oxide is formed when the insulating film is made of the silicon oxide.

As a result, by sealing a transparent substrate and liquid crystal with a sealing material under the silicon oxide film and forming a pixel Sw-Tr group on a single-crystal silicon layer on the silicon oxide film, it is possible to obtain a light valve substrate device with a small area and a large capacity.

(3) Moreover, because an insulator under a semiconductor film made of thin single-crystal silicon, Poly-Si, or a-Si comprises one aluminum nitride layer with very high heat conductivity or a plurality of layers containing at least an aluminum nitride layer, the heat produced due-to the operation of an integrated circuit formed in the semiconductor film made of thin single-crystal silicon, Poly-Si, or a-Si is-released into the aluminum nitride layer. As a result, it is possible to provide a stable semiconductor device with a high reliability without raising the temperature of the thin semiconductor film.

(4) Furthermore, because a passivation film serving as an insulator with a high heat conductivity is formed at the top of a Tr, diode, and integrated circuit formed in the semiconductor film made of thin single-crystal silicon, Poly-Si, or a-Si on a single-crystal silicon substrate or insulator, the heat produced in the single-crystal silicon substrate or the semiconductor film on the insulator is released into the passivation film. As a result, it is possible to provide a stable semiconductor device with a high reliability without raising the temperature of the semiconductor film on the single-crystal silicon substrate or insulator.

(5) Furthermore, the semiconductor substrate and light-valve semiconductor substrate of the present invention having a single-crystal silicon thin-device forming layer above an insulating substrate through an adhesive layer and an insulating layer on the single-crystal silicon thin-film device forming layer make it possible to quickly release the heat produced by a MOS integrated circuit formed on the single-crystal silicon thin-film device forming layer. Therefore, it is possible to prevent the Vt of a MOS transistor from rising even for a long-time operation and form a MOS integrated circuit with a high reliability, a driving circuit made of single-crystal silicon, and a light valve device in which an Sw-Tr is formed for each pixel.

What is claimed is:

1. A semiconductor-on-insulator integrated circuit device comprising: a supporting substrate; a thin film semiconductor layer mounted on the supporting substrate; and an integrated circuit formed in the thin film semiconductor layer, the integrated circuit including a heat radiating thin film disposed on the thin film semiconductor layer for radiating heat produced by the integrated circuit.

2. A semiconductor device according to claim 1; wherein the heat radiating thin film comprises a thermally conductive thin film material layer formed on the integrated circuit.

3. A semiconductor device according to claim 2; wherein the thermally conductive thin film material layer contains aluminum nitride.

4. A semiconductor device according to claim 2; further comprising an insulating passivation film disposed between the thermally conductive thin film material layer and the semiconductor layer, and wherein the thermally conductive thin film material layer contains at least one compound selected from the group consisting of aluminum nitride, aluminum oxide, metal, and carbon.

5. A semiconductor device according to claim 1, wherein the heat radiating thin film comprises a thermally conductive thin film material layer formed under the thin film semiconductor layer.

6. A semiconductor device according to claim 5; wherein the thermally conductive thin film material layer contains aluminum nitride.

7. A semiconductor device according to claim 5; further comprising an insulating film, wherein the insulating film and the thermally conductive thin film material layer are formed in layers under the thin film semiconductor layers and the thermally conductive thin film material layer contains at least one compound selected from the group consisting of aluminum nitride, aluminum oxide, metal, and carbon.

8. A semiconductor device according to claim 5; further comprising a silicon oxide layer, wherein the silicon oxide layer and the thermally conductive thin film material layer are formed under the thin film semiconductor layer, and the supporting substrate comprises at least one of a transparent insulating substrate and a single crystal silicon substrate provided under the thermally conductive thin film material layer.

9. A semiconductor device according to claim 5; further comprising a silicon oxide layer, wherein the thin film semiconductor layer comprises a single crystal silicon thin film layer, the silicon oxide layer and the thermally conductive thin film material layer are formed in layers under the single crystal silicon thin film layer, and the thermally conductive thin film material layer is thicker than the silicon oxide layer.

10. A semiconductor device according to claim 1; wherein the thin film semiconductor layer comprises at least one compound selected from the group consisting of single crystal silicon, polycrystalline silicon, and amorphous silicon.

11. A semiconductor device according to claim 1; wherein the thin film semiconductor layer is bonded to the supporting substrate, the supporting substrate comprises an insulating substrate, the heat radiating thin film comprises a thermally conductive thin film material layer disposed between the insulating substrate and the semiconductor layer.

12. A semiconductor device according to claim 11; wherein the thermally conductive thin film material layer comprises a thin film layer containing at least one compound selected from the group consisting of aluminum nitride, aluminum oxide, metal, and carbon.

13. A semiconductor device according to claim 11; wherein the thin film semiconductor layer includes a driving circuit region and a pixel region, and the thermally conductive thin film material layer is formed in a vicinity of the driving circuit region so as to dissipate heat generated by a circuit formed in the driving circuit region.

14. A semiconductor device according to claim 11; further comprising a wiring section which at least partially contacts the thermally conductive thin film material layer.

15. A semiconductor device according to claim 11; wherein the thermally conductive thin film material layer is electrically grounded.

16. A semiconductor device comprising: a semiconductor substrate having a first circuit region for forming at least one first circuit element in the semiconductor substrate and a second circuit region for forming at least one second circuit element in the semiconductor substrate; and an insulating film embedded in the semiconductor substrate under the first circuit region, such that the semiconductor substrate is effective to dissipate heat generated by operation of a circuit element in the second circuit region, where the insulating film is not embedded, more efficiently than heat generated by operation of a circuit element formed in the first circuit region, where the insulating film is embedded.

17. A semiconductor device according to claim 16; further comprising a plurality of circuit elements formed in the first and second circuit regions of the semiconductor substrate, and wherein an operation frequency of a circuit element device formed in the first circuit region, having the insulating layer embedded therein, is smaller than that of an operation frequency of a circuit element formed in the second circuit region, where the insulating film is not embedded.

18. A semiconductor device according to claim 16; wherein at least a portion of the semiconductor substrate under the insulating layer is removed.

19. A semiconductor device according to claim 16; wherein a pixel switching transistor is formed in the first circuit region, having the insulating layer embedded therein, and a driving circuit for driving the switching transistor is formed in the second circuit region, where no insulating layer is embedded.

20. A semiconductor device comprising: a semiconductor layer; an integrated circuit formed on the semiconductor layer and having separately formed driving circuit and pixel regions; and a plurality of metal-insulator-semiconductor field-effect transistors formed in the driving circuit and the pixel regions, each metal-insulator-semiconductor field-effect transistor comprising a gate electrode and a gate insulator formed on the semiconductor layer, a source region and a drain region both formed in the semiconductor layer, and a channel forming region disposed between the source and the drain regions; wherein a gate length of a metal-insulator-semiconductor field-effect transistor formed in the pixel region is larger than the minimum gate length among the gate lengths of a plurality of metal-insulator-semiconductor field-effect transistors formed in the driving circuit region to restrain the heat produced due to operation of the metal-insulator-semiconductor field-effect transistor in the pixel region.

21. A semiconductor device comprising: a semiconductor layer; an integrated circuit formed on the semiconductor layer and having separately formed driving circuit and pixel regions; and a plurality of metal-insulator-semiconductor field-effect transistors formed in the driving circuit and the pixel regions, each metal-insulator-semiconductor field-effect transistor comprising a gate electrode and a gate insulator formed on the semiconductor layer, a source region and a drain region both formed in the semiconductor layer, and a channel forming region disposed between the source and the drain regions; wherein an impurity concentration of the source region and the drain region of the metal-insulator-semiconductor field-effect transistor formed in the pixel region is lower proximate the channel forming region thereof than in a portion spaced from the channel forming region to restrain the heat produced due to operation of the metal-insulator-semiconductor field-effect transistor in the pixel region.

22. A semiconductor device comprising: a semiconductor layer; an integrated circuit formed on the semiconductor layer and having separately formed driving circuit and pixel regions; and a plurality of metal-insulator-semiconductor field-effect transistors formed in the driving circuit and the pixel regions, each metal-insulator-semiconductor field-effect transistor comprising a gate electrode and a gate insulator formed on the semiconductor layer, a source region and a drain region both formed in the semiconductor layer, and a channel forming region disposed between the source and the drain regions; wherein a gate width of a metal-insulator-semiconductor field-effect transistor formed the pixel region is equal to or smaller than a predetermined minimum gate width among all of the metal-insulator-semiconductor field-effect transistors formed in the driving circuit region to restrain the heat produced due to operation of the metal-insulator-semiconductor field-effect transistor in the pixel region.

23. A semiconductor device according to claim 1; wherein the thin film semiconductor layer has a first surface opposing the supporting substrate and a second surface opposing the heat radiating thin film.

24. A semiconductor device according to claim 1; further comprising an insulating film, wherein the insulating film and the heat radiating thin film are formed in layers over the thin film semiconductor layer opposite the supporting substrate.

* * * * *